(12) United States Patent
Okinoi et al.

(10) Patent No.: US 11,798,635 B2
(45) Date of Patent: Oct. 24, 2023

(54) SEMICONDUCTOR INTEGRATED CIRCUIT

(71) Applicant: Socionext Inc., Kanagawa (JP)

(72) Inventors: Masanori Okinoi, Yokohama (JP);
Sachio Ogawa, Yokohama (JP); Ryo Azumai, Yokohama (JP); Kiichi Hamasaki, Yokohama (JP)

(73) Assignee: Socionext Inc., Kanagawa (JP)

( * ) Notice: Subject to any disclaimer, the term of this patent is extended or adjusted under 35 U.S.C. 154(b) by 195 days.

(21) Appl. No.: 17/457,291

(22) Filed: Dec. 2, 2021

(65) Prior Publication Data

US 2022/0093189 A1 Mar. 24, 2022

Related U.S. Application Data

(63) Continuation of application No. PCT/JP2019/023240, filed on Jun. 12, 2019.

(51) Int. Cl.
*G11C 16/32* (2006.01)
*G11C 7/22* (2006.01)
*H03K 19/0185* (2006.01)
*G11C 5/14* (2006.01)

(52) U.S. Cl.
CPC .......... *G11C 16/32* (2013.01); *G11C 7/22* (2013.01); *H03K 19/0185* (2013.01); *G11C 5/144* (2013.01)

(58) Field of Classification Search
CPC .................................................... G11C 16/32
See application file for complete search history.

(56) References Cited

U.S. PATENT DOCUMENTS

| 6,087,870 A | 7/2000 | Sakamoto |
| 7,376,037 B1 * | 5/2008 | Law .................. G11C 5/144 |
| | | 365/229 |
| 2006/0022711 A1 | 2/2006 | Sumita |

(Continued)

FOREIGN PATENT DOCUMENTS

| JP | H10-050070 | 2/1998 |
| JP | H10-320089 | 12/1998 |

(Continued)

OTHER PUBLICATIONS

International Search Report dated Sep. 17, 2019 with respect to No. PCT/JP2019/023240.

(Continued)

*Primary Examiner* — Jason Lappas
(74) *Attorney, Agent, or Firm* — IPUSA, PLLC

(57) ABSTRACT

A semiconductor integrated circuit includes a buffer which outputs a memory control signal to a terminal coupled to a memory device, a power supply control circuit which controls a supply of a power supply voltage from a power supply line to the buffer based on a power control signal, a pull-up control circuit configured to control a pull-up of the terminal based on a pull-up control signal, and a control signal generating circuit. The control signal generating circuit generates, during an output period, the power control signal to supply the power supply voltage to the buffer, and the pull-up control signal to stop the pull-up of the terminal, and generates, during an idle period, the power control signal to stop the supply of the power supply voltage to the buffer, and the pull-up control signal to perform the pull-up of the terminal.

16 Claims, 17 Drawing Sheets

(56) References Cited

U.S. PATENT DOCUMENTS

2006/0214684 A1  9/2006  Bando et al.
2012/0278539 A1  11/2012  Hosogaya

FOREIGN PATENT DOCUMENTS

| JP | 2006-074746 | 3/2006 |
| JP | 2006-279273 | 10/2006 |
| JP | 2012-230621 | 11/2012 |
| JP | 2015-011730 | 1/2015 |

OTHER PUBLICATIONS

Written Opinion of The International Searching Authority dated Sep. 17, 2019 with respect to PCT/JP2019/023240, with English translation of the relevant part.

* cited by examiner

FIG.4

|  | INPUT | | | | OUTPUT |
|---|---|---|---|---|---|
|  | EN | POEN | NOEN | IN | OUT |
| IDLE PERIOD | L | L | L | H/L | H |
| TRANSITION PERIOD | H | L | L | H | H |
| OUTPUT PERIOD | H | H | L | H/L | H/L |

FIG.7

|  | INPUT | OUTPUT CIRCUIT 10 | | | | OUTPUT CIRCUIT 12 | | | |
|---|---|---|---|---|---|---|---|---|---|
|  |  | INPUT | | | OUTPUT | INPUT | | | OUTPUT |
|  | EN | POEN | NOEN | IN | OUT | POEN2 | NOEN2 | /IN | /OUT |
| IDLE PERIOD | L | L | L | H/L | H | H | H | L/H | L |
| TRANSITION PERIOD | H | L | L | H | H | H | H | L | L |
| OUTPUT PERIOD | H | H | L | H/L | H/L | H | L | L/H | L/H |

FIG.11

|  | INPUT | | | | OUTPUT |
|---|---|---|---|---|---|
|  | EN | POEN | NOEN | IN | OUT |
| IDLE PERIOD | L | L | L | H/L | H |
| OUTPUT PERIOD | H | H | L | H/L | H/L |

FIG.14

|  | INPUT | | | | | INPUT AND OUTPUT | OUTPUT |
|---|---|---|---|---|---|---|---|
|  | EN | POEN | NOEN | PIEN | NIEN | IN | IO | Y |
| OUTPUT IDLE PERIOD | L | L | L | H | L | H/L | H | H |
| TRANSITION PERIOD | H | L | L | H | L | H | H | H |
| OUTPUT PERIOD | H | H | L | H | L | H/L | H/L | H/L |
| INPUT IDLE PERIOD | L | H | L | H | H | H/L | L | L |
| INPUT PERIOD | L | H | L | L | H | H/L | H/L | H/L |

SEMICONDUCTOR INTEGRATED CIRCUIT

CROSS-REFERENCE TO RELATED APPLICATIONS

This application is a continuation application of International Application No. PCT/JP2019/023240 filed on Jun. 12, 2019 and designated the U.S., the entire contents of which are incorporated herein by reference.

FIELD

The embodiments discussed herein are related to semiconductor integrated circuits.

BACKGROUND

Due to the process or optical shrink of devices such as transistors forming semiconductor integrated circuits, a deterioration phenomenon in which the transistor characteristics (or characteristics of the transistor) deteriorate when a conductive state of the transistor continues is becoming a problem. For example, when the transistor characteristics driving an output terminal of the semiconductor integrated circuit deteriorate, and a duty ratio of a signal output to an output terminal varies, a signal reception margin of a device at an output destination of the signal decreases. The decrease in the signal reception margin becomes more severe as an operating frequency becomes high.

The deterioration of the transistor characteristics also occurs in pull-up transistors which constantly pull up the output terminal. For this reason, a technique has been proposed to disperse the deterioration of the transistor characteristics, by forming the pull-up transistors from a plurality of transistors connected in parallel, and by changing the switching timings among the transistors.

When switching the pull-up transistors between the conductive state and the non-conductive state according to an output signal output from the output terminal, instead of constantly putting the pull-up transistors in the conductive state, an erroneous output signal may be generated due to the effects of noise or the like if the output terminal assumes a high impedance state.

A semiconductor device designed to prevent deterioration of the characteristics over time caused by Negative Bias Temperature Instability (NBTI), is proposed in Japanese Laid-Open Patent Publication No. 2006-074746, for example.

SUMMARY

Accordingly, it is an object in one aspect of the embodiments to provide a semiconductor integrated circuit which can prevent an output terminal from assuming a high impedance state when setting the output terminal to a predetermined voltage according to an output signal output from the output terminal.

According to one aspect of the embodiments, a semiconductor integrated circuit includes an output buffer configured to output a memory control signal, which is to be supplied to a memory device, to an external terminal coupled to the memory device; a power supply control circuit configured to control a supply of a power supply voltage from a power supply line to the output buffer, based on a power control signal; a pull-up control circuit configured to control a pull-up of the external terminal, based on a pull-up control signal; and a control signal generating circuit configured to generate, during an output period in which the memory control signal is output to the external terminal, the power control signal which controls the power supply control circuit to supply the power supply voltage to the output buffer, and the pull-up control signal which controls the pull-up control circuit to stop the pull-up of the external terminal, and generate, during an idle period in which the memory control signal is not output to the external terminal, the power control signal which controls the power supply control circuit to stop the supply of the power supply voltage to the output buffer, and the pull-up control signal which controls the pull-up control circuit to perform the pull-up of the external terminal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating the logic of signals which operate an output circuit illustrated in FIG. 1.

FIG. 7 is a diagram illustrating the logic of signals which operate an output circuit illustrated in FIG. 6.

FIG. 11 is a diagram illustrating the logic of the signals which operate the output circuit illustrated in FIG. 1 in the second embodiment.

FIG. 14 is a diagram illustrating the logic of signals which operate an output circuit and pull-up and pull-down circuits illustrated in FIG. 13.

DESCRIPTION OF EMBODIMENTS

Figure 1:
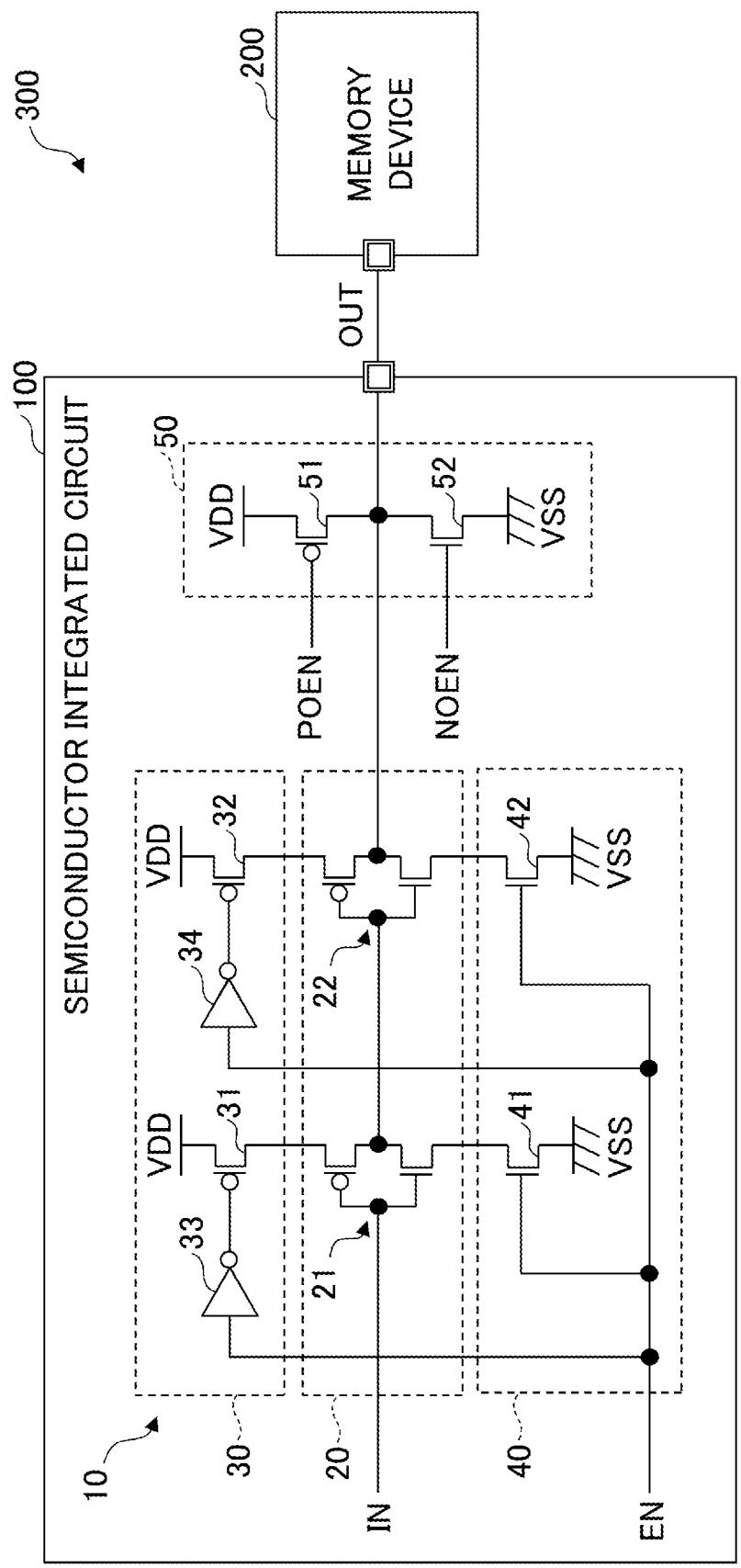
FIG. 1 is a diagram illustrating a configuration of a semiconductor integrated circuit according to a first embodiment.

Preferred embodiments of the present invention will be described with reference to the accompanying drawings.

A description will now be given of a semiconductor integrated circuit according to each embodiment of to the present invention. In this specification, signals, and signal lines for transmitting the signals, are designated by the same reference numerals or characters. Similarly, a power supply, and a power supply line for supplying a voltage from the power supply, are designated by the same reference numerals or characters. Further, an external terminal of a chip is indicated by a double rectangle.

First Embodiment

FIG. 1 illustrates a configuration of a semiconductor integrated circuit 100 according to a first embodiment. A system 300 is mounted with the semiconductor integrated circuit 100, together with a memory device 200. For example, the semiconductor integrated circuit 100 may be a System on a Chip (SoC), and the memory device 200 may be a NAND type flash memory. The system 300 has the semiconductor integrated circuit 100 and the memory device 200 mounted on a system board, and interconnects the semiconductor integrated circuit 100 and the memory device 200 via interconnects formed on the system board. The semiconductor integrated circuit 100 may be a Central Processing Unit (CPU), and the memory device 200 may be other than the NAND type flash memory.

In FIG. 1, only an output circuit 10 of the semiconductor integrated circuit 100, which outputs an output signal OUT to the memory device 200, is illustrated. The output circuit 10 includes an output buffer 20, high impedance control circuits 30 and 40 connected to the output buffer 20, and a pull-up and pull-down circuit (hereinafter also referred to as "pull-up/pull-down circuit") 50. The high impedance control circuit 30 is an example of a power supply control circuit.

For example, the output signal OUT may be a read enable signal REN. The semiconductor integrated circuit 100 outputs to memory device 200 the read enable signal REN which alternately assumes a high level and a low level, during a read cycle in which data are read from memory device 200. The memory device 200 outputs read data to the semiconductor integrated circuit 100 in response to a rising edge and a falling edge of the read enable signal REN. That is, the memory device 200 operates with a Double Data Rate (DDR).

In this case, the memory device 200 outputs the read data in synchronization with a falling edge and a rising edge of a data strobe signal which is generated in the memory device 200. The output signal OUT may be a control signal other than the read enable signal REN. The output signal OUT is an example of a memory control signal.

The output buffer 20 includes two Complementary Metal Oxide Semiconductor (CMOS) inverters 21 and 22, which are connected in series, to transmit a signal IN, which is an original signal of the output signal OUT, to the output terminal OUT. A source of a p-channel MOS transistor of the CMOS inverters 21 and 22 is connected to a power supply line VDD via the high impedance control circuit 30. A source of an n-channel MOS transistor of the CMOS inverters 21 and 22 is connected to a ground line VSS (a kind of power supply line) via the high impedance control circuit 40.

The p-channel MOS transistor is indicated by a transistor having a circular mark added to the gate, and the n-channel MOS transistor is indicated by a transistor having no circular mark added to the gate. In the following description, the p-channel MOS transistor may simply be referred to as a pMOS, and the n-channel MOS transistor may simply be referred to as an nMOS.

The high impedance control circuit 30 includes pMOSs 31 and 32 connected between the power supply line VDD and sources of pMOSs of the CMOS inverters 21 and 22, respectively. Gates of the pMOSs 31 and 32 receive an inverted logic of an enable signal EN via inverters 33 and 34, respectively. The enable signal EN is an example of a power control signal. The pMOSs 31 and 32 are examples of a power switch which turns on or off based on the enable signal EN.

The high impedance control circuit 40 includes nMOSs 41 and 42 connected between the ground line VSS and sources of the nMOSs of the CMOS inverters 21 and 22, respectively. The gates of the nMOSs 41 and 42 receive the enable signal EN.

The output circuit 10 transmits the signal IN to the output terminal OUT during a high-level period of the enable signal EN, and stops transmitting the signal IN to the output terminal OUT during a low-level period of the enable signal EN. For example, the high level may be the power supply voltage VDD, and the low level may be the ground voltage VSS.

The pull-up/pull-down circuit 50 includes a pMOS 51 connecting between the power supply line VDD and the output terminal OUT, and an nMOS 52 connecting between the output terminal OUT and the ground line VSS. The pMOS 51 becomes conductive during a low-level period of an enable signal POEN, and connects the output terminal OUT to the power supply line VDD. The pull-up/pull-down circuit 50 is an example of a pull-up control circuit, and the enable signal POEN is an example of a pull-up control signal. The pMOS 51 is an example of a pull-up switch which functions as a resistive element during an on state of the pMOS 51.

The nMOS 52 becomes conductive during a high-level period of an enable signal NOEN, and connects the output terminal OUT to the ground line VSS. In this specification, "conductive" refers to a state where the source and the drain of the transistor are electrically connected, and the transistor is on. On the other hand, "non-conductive" refers to a state where the source and the drain of the transistor are electrically cut off, and the transistor is off.

Figure 6:
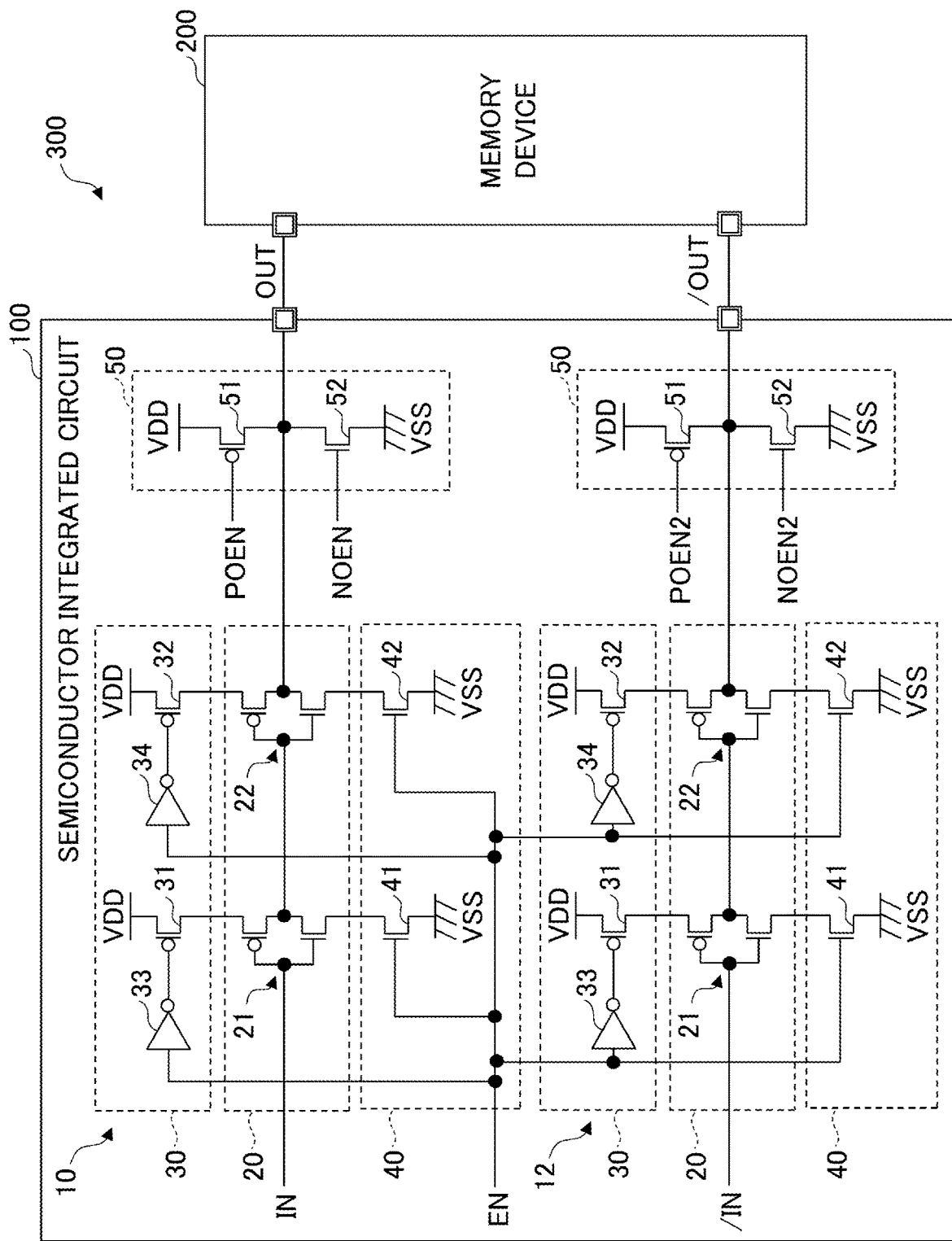
FIG. 6 is a diagram illustrating a configuration for a case where the semiconductor integrated circuit illustrated in FIG. 1 outputs complementary output signals to a memory device.

The read enable signal REN may be complementary signals. In this case, apart from the output circuit 10 illustrated in FIG. 1, the semiconductor integrated circuit 100 includes an output circuit which outputs a negative logic read enable signal to the memory device 200. For example, circuit configurations of the output circuits 10 which output the complementary read enable signals may be the same. An example of controlling the complementary signals output to the memory device 200 is illustrated in FIG. 6 which will be described later.

Figure 2:
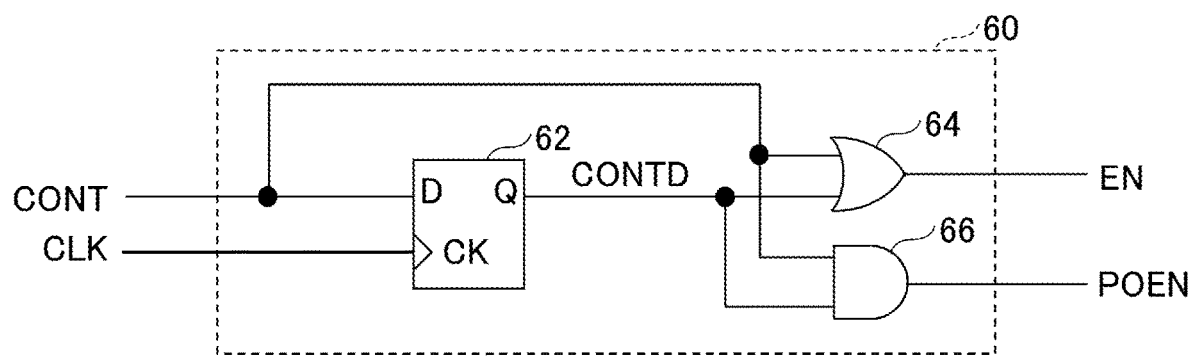
FIG. 2 is a diagram illustrating a control signal generating circuit which generates an enable signal illustrated in FIG. 1.

FIG. 2 illustrates a control signal generating circuit 60 which generates the enable signals EN and POEN illustrated in FIG. 1. The control signal generating circuit 60 is mounted to the semiconductor integrated circuit 100. The control signal generating circuit 60 includes a latch circuit 62, an OR circuit 64, and an AND circuit 66. The latch circuit 62 is an example of a delay circuit.

The latch circuit 62 has a data input terminal D, a clock terminal CK, and an output terminal Q. The data input terminal D receives a control signal CONT which is set to a high level during an output period which will be described later in conjunction with FIG. 5, and is set to a low level during an idle period. The clock terminal CK receives a clock signal CLK. The output terminal Q outputs a delayed control signal CONTD. The control signal CONT is an example of a timing signal, and the delayed control signal CONTD is an example of a delay timing signal.

For example, the clock signal CLK is a synchronization clock which operates internal circuits of the semiconductor integrated circuit 100. However, the clock signal CLK may be obtained by frequency-dividing the synchronization clock, or other clock signals may be used as the clock signal CLK. The OR circuit 64 receives the control signal CONT and the delayed control signal CONTD, and outputs the enable signal EN. The AND circuit 66 receives the control signal CONT and the delayed control signal CONTD, and outputs the enable signal POEN.

A delay circuit including resistive and capacitive elements may be used in place of the latch circuit 62. However, by using the latch circuit 62, it is possible to generate the delayed control signal CONTD which causes a delay of a clock cycle time. On the other hand, when generating the clock cycle time using the delay circuit including the resistive and capacitive elements, the delay time may vary due to variations or the like of the manufacturing process of the semiconductor integrated circuit 100. In other words, the use of the latch circuit 62 enables setting of the delay time without being affected by the variations or the like of the manufacturing process.

Figure 3:
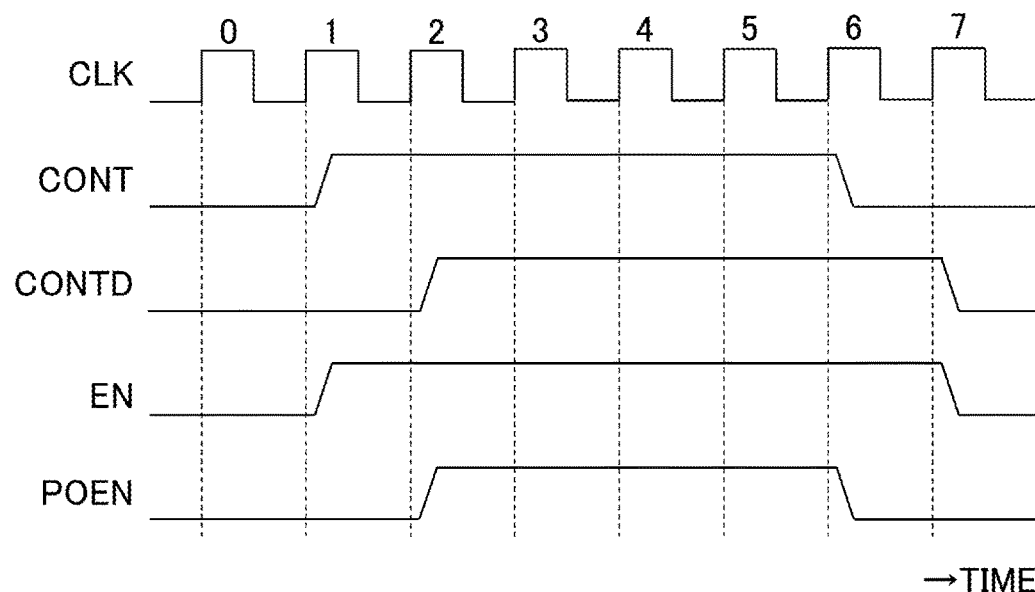
FIG. 3 is a diagram illustrating timings of signals which operate the control signal generating circuit illustrated in FIG. 2.

FIG. 3 illustrates timings of the signals which drive the control signal generating circuit 60 illustrated in FIG. 2. The latch circuit 62 illustrated in FIG. 2 latches the control signal CONT by synchronizing to the clock signal CLK, and outputs the delayed control signal CONTD which is the latched control signal CONT delayed by one clock cycle. The OR circuit 64 obtains a logical sum of the control signal CONT and the delayed control signal CONTD. The OR circuit 64 generates the enable signal EN having a rising edge corresponding to a rising edge of the control signal CONT, and a falling edge corresponding to a falling edge of the delayed control signal CONTD.

The AND circuit 66 obtains a logical product of the control signal CONT and the delayed control signal CONTD. The AND circuit 66 generates the enable signal POEN having a rising edge corresponding to a rising edge of the delayed control signal CONTD, and a falling edge corresponding to a falling edge of the control signal CONT.

The control signal generating circuit 60 can generate the enable signal POEN including a high-level period during the high-level period of the enable signal EN. In other words, by using the OR circuit 64 and the AND circuit 66, it is possible to generate the enable signals EN and POEN having a predetermined inclusion relationship, using a simple circuit. In addition, the control signal generating circuit 60 can generate the enable signals EN and POEN having different timings, based on the single control signal CONT.

FIG. 4 illustrates the logic (truth table) of the signals which drives the output circuit 10 illustrated in FIG. 1. In the truth table, an "input" represents an input signal to the output circuit 10, and an "output" represents an output signal from the output circuit 10.

The output period refers to a period in which the output signal OUT (read enable signal REN) is output to the memory device 200 during the read cycle. The idle period refers to a period provided before and after the output period of the output signal OUT, for example, during the read cycle. A transition period refers to a period in which a transition is made from the idle period to the output period, and a period in which a transition is made from the output period to the idle period, during the read cycle.

During the idle period, the enable signals EN, POEN, NOEN are set to a low level L, and the signal IN is set to a high level H or a low level L. The pMOSs 31 and 32 of the high impedance control circuit 30, and the nMOSs 41 and 42 of the high impedance control circuit 40, are respectively controlled to the non-conductive states by the enable signal EN having the low level L. For this reason, the output buffer 20 is cut off from the power supply line VDD and the ground line VSS.

When the enable signal POEN has the low level L, the pMOS 51 of the pull-up/pull-down circuit 50 assumes the conductive state, and the output terminal OUT is set to the high level H. In other words, even when the output buffer 20 is cut off from the power supply line VDD, the pull-up/pull-down circuit 50 sets the output terminal OUT to the high level H, without putting the output terminal OUT into a high impedance state. Accordingly, even when not pulling up an output signal line OUT on the system board, for example, it is possible to prevent the output terminal OUT from assuming the high impedance state.

Because the output terminal OUT does not assume the high impedance state, it is possible to prevent the generation of an erroneous output signal OUT due to a voltage variation of a signal line adjacent to the output signal line OUT, for example, thereby preventing an erroneous operation of the memory device 200. The nMOS 52 of the pull-up/pull-down circuit 50 assumes the non-conductive state when the enable signal NOEN has the low level L.

During the transition period, the enable signal EN is set to the high level H, the enable signals POEN and NOEN are set to the low level L, and the signal IN is set to the high level H. The pMOSs 31 and 32 of the high impedance control circuit 30, and the nMOSs 41 and 42 of the high impedance control circuit 40, are respectively controlled to the conductive states by the enable signal EN having the high level H.

Accordingly, the CMOS inverter 21 outputs a low level L, and the CMOS inverter 22 outputs a high level H. On the other hand, the pMOS 51 of the pull-up/pull-down circuit 50 is maintained to the conductive state by the enable signal POEN having the low level L. By providing the transition period in which the high-level periods of the signal IN and the enable signal EN and the low-level period of enable signal POEN overlap, it is possible to prevent the output terminal OUT from assuming the high impedance state. The operation of the output circuit 10 when the enable signal NOEN has the low level L is the same as the operation during the idle period.

The output period is the period in which the output signal OUT (for example, the read enable signal REN) is output to the memory device 200. During the output period, the enable signals EN and POEN are set to the high level H, and the enable signal NOEN is set to the low level L. The signal IN is set to a high level H or low level L, according to the logic of the output signal OUT supplied to the memory device 200. The operation of the output circuit 10 during the output period is similar to the operation during the transition period, except that the logic of the output terminal OUT changes according to the logic of the signal IN.

When the enable signal POEN has the high level H, the pMOS 51 of the pull-up/pull-down circuit 50 assumes the non-conductive state. However, when the enable signal EN has the high level H, the output terminal OUT assumes the same logic as the signal IN, and thus, it is possible to prevent the output terminal OUT from assuming the high impedance state. The operation of the output circuit 10 when the enable signal NOEN has the low level L is the same as the operation during the idle period.

Figure 5:
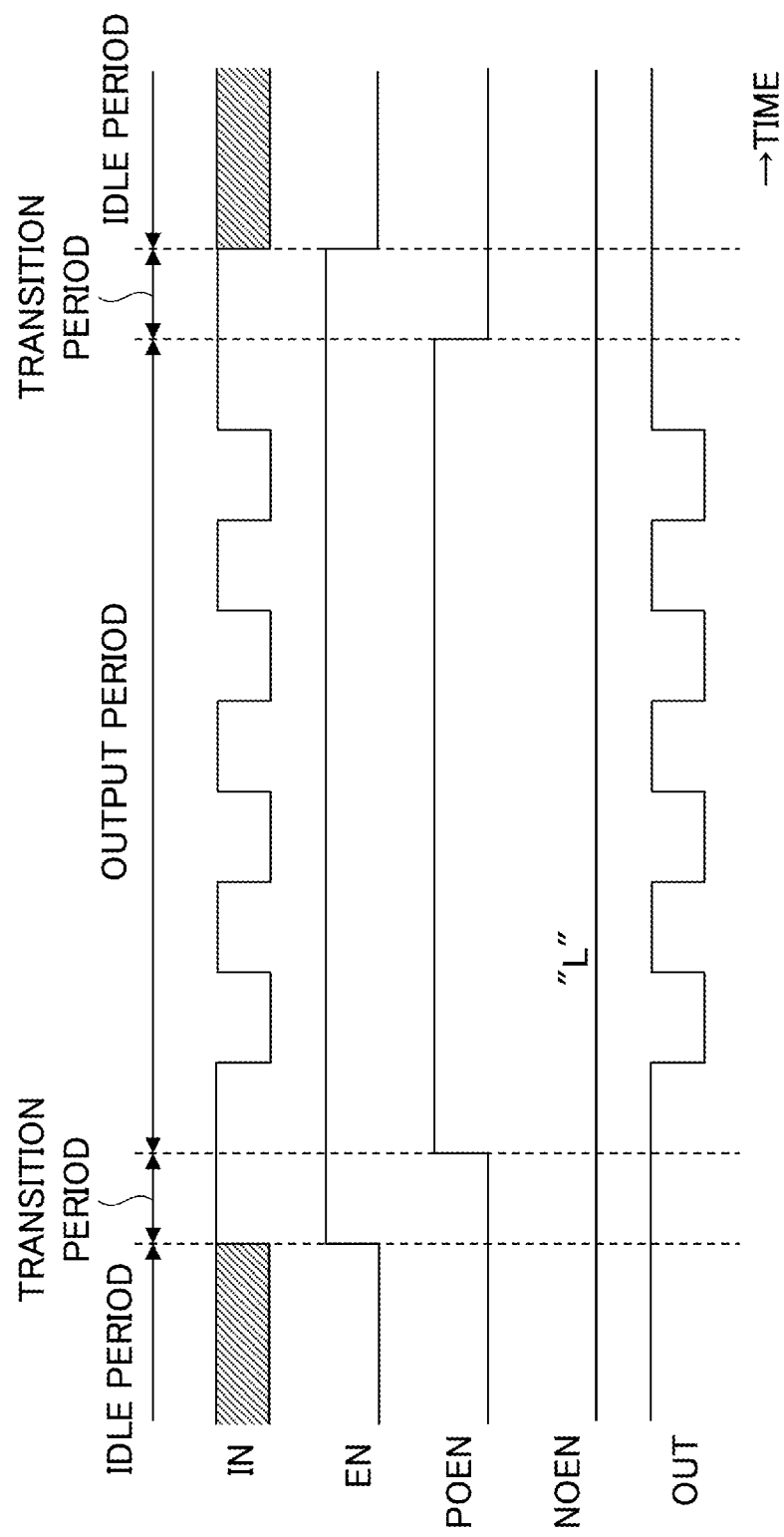
FIG. 5 is a diagram illustrating timings of signals which operate the output circuit illustrated in FIG. 1.

FIG. 5 illustrates the timings of the signals which operate the output circuit 10 illustrated in FIG. 1. Waveforms (logic levels) of the signals IN, EN, POEN, NOEN, and OUT during the idle period and the transition period are the same as those of the truth table illustrated in FIG. 4. A rectangular wave indicated by hatchings during the idle period of the signal IN, indicates that the signal IN has the high level H or the low level L.

During the output period in which the enable signals EN and POEN have the high level H, the output signal OUT which is generated has the same logic as the signal IN. For example, the signal IN, synchronized to the clock signal used in semiconductor integrated circuit 100, is generated, and the signal IN has the same frequency as the clock signal. In the case of the read enable signal REN which is generated when supplying the output signal OUT to the flash memory, the flash memory successively outputs data (or data signal, not illustrated) in response to each transition edge of the read enable signal REN, after a predetermined time from each transition edge. The semiconductor integrated circuit 100 outputs to the memory device 200 a read command which causes the memory device 200 to perform a read operation, prior to outputting the waveforms illustrated in FIG. 5.

For example, the output signal OUT, which is the read enable signal REN output to the memory device 200, maintains the high level H during periods other than the output period. During a period in which the power is supplied to the semiconductor integrated circuit 100 and the memory device 200, the idle period is typically, considerably longer than the output period.

In this embodiment, during the idle period, the output signal OUT having the high level H is generated by controlling the pMOS 51 of the pull-up/pull-down circuit 50 to the conductive state, and the pMOS of the CMOS inverter 22 of the output buffer 20 is maintained to the non-conductive state. For this reason, it is possible to prevent the pMOS of the CMOS inverter 22 from Bias Temperature (BT) degradation during the idle period. The pMOS of the CMOS inverter 22 generates the rising edge of the output signal OUT. For this reason, when the BT degradation occurs and the rising waveform of the output signal OUT becomes gradual, the duty ratio of the output signal OUT during the output period may not satisfy the electrical specifications of the memory device 200.

The BT degradation may occur in the pMOS 51 of the pull-up/pull-down circuit 50 which maintains the conductive state during the idle period after the semiconductor integrated circuit 100 is used for a long period of time. However, even if BT degradation occurs in the pMOS 51, the access to the memory device 200 is unaffected because the output signal OUT is maintained at the high level H at the falling edge timing of the enable signal POEN illustrated in FIG. 5.

In other words, in this embodiment, during the idle period in which the read access to the memory device 200 is not performed, the BT degradation is caused to occur in the pMOS 51, in place of the pMOS of the CMOS inverter 22, which generates the output signal OUT supplied to the memory device 200. Hence, it is possible to prevent the duty ratio of the output signal OUT, generated during the output period, from varying.

In a case where the output circuit 10 does not have the high impedance control circuits 30 and 40, the pMOS of the CMOS inverter 22 is maintained to the conductive state, for example, in order to maintain the output terminal OUT to the high level H. In this case, the BT degradation occurs in the pMOS of the CMOS inverter 22 after the semiconductor integrated circuit 100 is used for a long period of time, and the duty ratio of the output signal OUT generated during the output period may vary.

FIG. 6 illustrates a configuration for a case where the semiconductor integrated circuit 100 illustrated in FIG. 1 outputs complementary output signals OUT and /OUT to the memory device 200. For example, the output signal OUT is a positive logic (true) read enable signal REN, and the output signal /OUT is a negative logic (complementary) read enable signal REN. The output signal /OUT is an example of a complementary memory control signal, and an output terminal/OUT is an example of a complementary external terminal.

A circuit configuration of an output circuit 12 (20, 30, 40, 50) which generates the output signal /OUT may be the same as the circuit configuration of the output circuit 10 (20, 30, 40, 50). In addition, the output circuit 12 operates in response to receiving the same enable signal EN as the output circuit 10. However, an output buffer 20 of the output circuit 12 receives a signal /IN having a negative logic opposite to the logic of the signal IN, and outputs the output signal /OUT having the negative logic. The output buffer 20 of the output circuit 12 is an example of a complementary output buffer, and a high impedance control circuit 40 of the output circuit 12 is an example of a complementary power supply control circuit. The ground line VSS is an example of a complementary power supply line, and the ground voltage VSS is an example of a complementary power supply voltage.

The pMOS 51 and the nMOS 52 of a pull-up/pull-down circuit 50 in the output circuit 12 receive an enable signal POEN2 and an enable signal NOEN2, respectively. In the pull-up/pull-down circuit 50 of the output circuit 12, the nMOS 52 is provided to pull-down the output terminal /OUT for the negative logic signal /IN to the low level L. The nMOS 52 of the pull-up/pull-down circuit 50 in the output circuit 12 is an example of a pull-down control circuit, and the enable signal NOEN2 is an example of a pull-down control signal.

When outputting the complementary output signals OUT and /OUT to the memory device 200, the output circuit 10 for the output signal OUT, and the output circuit 12 for the output signal /OUT, may respectively be designed to the same circuit, and the same layout data may be used except for the interconnect layer. Similarly, the pull-up/pull-down circuit 50 for the output signal OUT, and the pull-up/pull-down circuit 50 for the output signal /OUT, may respectively be designed to the same circuit, and the same layout data may be used except for the interconnect layer. The use of the same circuit design can improve the design efficiency.

FIG. 7 illustrates the logic (truth table) of signals which operate the output circuits 10 and 12 illustrated in FIG. 6. A detailed description of FIG. 7 for the same states as FIG. 4 will be omitted. For example, the logic of the enable signal EN and the logic of the signals which operate the output circuit 10 are the same as in FIG. 2, and the operation of the output circuit 10 is the same as in FIG. 4.

During the idle period in the output circuit 12 which outputs the output signal /OUT, the enable signals POEN2 and NOEN2 are set to the high level H, the signal /IN is set to the low level L or the high level H, and the signal /IN is set to a logic opposite to the logic of the signal IN. The output circuit 12 receives the same enable signal EN as the output circuit 10. Hence, during the idle period, the pMOSs 31 and 32, and the nMOSs 41 and 42 assume the non-conductive state in the output circuit 12, similar to the output circuit 10, and the output buffer 20 is cut off from the power supply line VDD and the ground line VSS.

During the idle period, the nMOS 52 of the pull-up/pull-down circuit 50 in the output circuit 12 is controlled to the conductive state by the enable signal NOEN2 having the high level H, to set the output terminal /OUT to the low level L. Hence, even when the output signal line /OUT is not pulled down on the system board, for example, it is possible to prevent the output signal line /OUT from assuming the high impedance state, thereby preventing an erroneous operation of the memory device 200. The pMOS 51 of the pull-up/pull-down circuit 50 in the output circuit 12 is controlled to the non-conductive state by the enable signal POEN2 having the high level H.

During the transition period, the enable signals POEN2 and NOEN2 are set to the high level H, and the signal /IN is set to the low level L. In the output circuit 12, the pMOSs 31 and 32 of the high impedance control circuit 30 and the nMOSs 41 and 42 of the high impedance control circuit 40 are respectively controlled to the conductive state by the enable signal EN having the high level H. The pMOS 51 of the pull-up/pull-down circuit 50 in the output circuit 12 is controlled to the non-conductive state by the enable signal POEN2 having the high level H.

Accordingly, the low level L of the output terminal /OUT is maintained by the high level H output by the output buffer 20 of the output circuit 12 based on the signal /IN having the low level L, and the nMOS 52 which maintains the conductive state by the enable signal NOEN2 having the high level H. By providing the transition period in which the low-level period of the signal /IN, the high-level period of the enable signal EN, and the high-level period of the enable signal NOEN2 overlap, it is possible to prevent the output terminal /OUT from assuming the high impedance state.

During the output period, the enable signal POEN2 is set to the high level H, and the enable signal NOEN2 is set to the low level L. In addition, the signal /IN is set to the low level L or the high level H according to the logic of the output signal /OUT supplied to the memory device 200. The pMOS 51 of the pull-up/pull-down circuit 50 in the output circuit 12 assumes the non-conductive state, by the enable signal POEN2 having the high level H. The operation of the output circuit 12 during the output period is similar to the operation during the transition period, except that the logic of the output terminal /OUT varies according to the logic of the signal /IN.

The nMOS 52 of the pull-up/pull-down circuit 50 in the output circuit 12 assumes the non-conductive state, by the enable signal NOEN2 having the low level L. However, because the output terminal /OUT assumes the same logic as the signal /IN by the enable signal EN having the high level H, it is possible to prevent the output terminal /OUT from assuming the high impedance state. The enable signal NOEN2 is a signal having an inverted logic of the enable signal POEN, and may be generated by inverting the logic of the output of the AND circuit 66 illustrated in FIG. 2 by an inverter.

Figure 8:
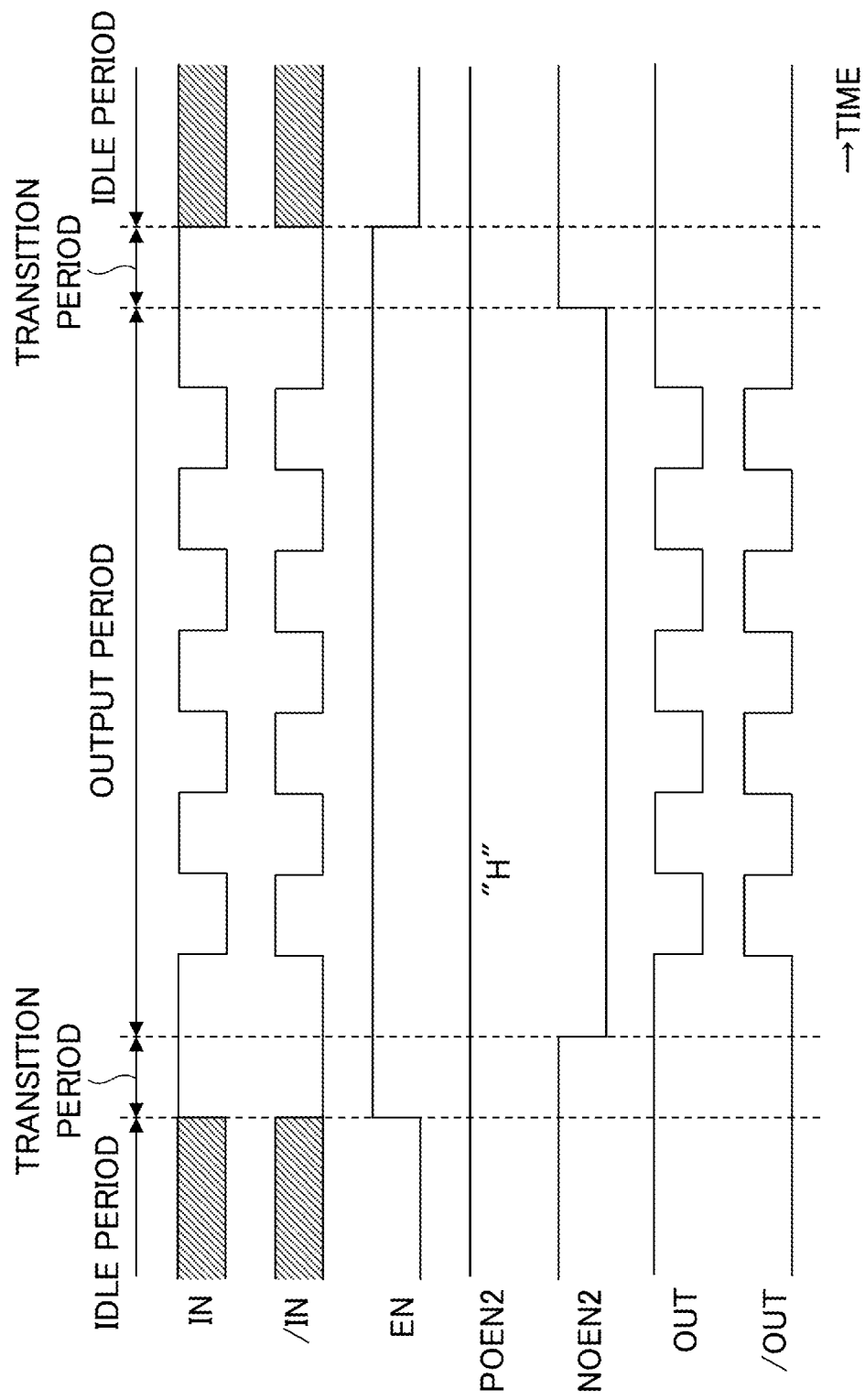
FIG. 8 is a diagram illustrating timings of the signals which operate the output circuit illustrated in FIG. 6.

FIG. 8 illustrates the timings of the signals which operate the output circuits 10 and 12 illustrated in FIG. 6. A detailed description of FIG. 8 for the same operations as FIG. 5 will be omitted. Because the waveforms of the enable signals POEN and NOEN are the same as in FIG. 5, the illustration thereof will be omitted. The output circuits 10 and 12 operate according to the truth table illustrated in FIG. 7, and the complementary output signals OUT and /OUT (read enable signals REN) are output to the memory device 200 during the output period.

For example, the output signal /OUT, which is the negative logic read enable signal REN to the memory device 200, is fixed to the low level during periods other than the output period. During idle period, the output of the output buffer 20 of the output circuit 12 is in the high impedance state, and the low level L of the output signal /OUT is generated by controlling the nMOS 52 of the pull-up/pull-down circuit 50 in the output circuit 12 to the conductive state.

Because the BT degradation is less likely to occur in the nMOS compared to the pMOS, the high impedance control circuits 30 and 40 may be omitted in the output circuit 12, and the output buffer 20 may be directly connected to the power supply line VDD and the ground line VSS. In this case, the pull-up/pull-down circuit 50 of the output circuit 12 may be omitted.

Further, during the idle period, the nMOS in the last stage of the output buffer 20 is maintained to the conductive state according to the signal /IN having the low level L, and the output terminal /OUT is maintained at the low level L. However, if the output circuits 10 and 12 have different circuit configurations, the phases of the output signals OUT and /OUT may not match during the output period. For this reason, in this embodiment, the output circuits 10 and 12 have the same circuit configuration as illustrated in FIG. 6, thereby matching the phases of the output signals OUT and /OUT. In other words, the circuit configuration illustrated in FIG. 6 can improve design efficiency, and match the phases of the output signals OUT and /OUT, thereby improving an operating margin of the memory device 200.

As described above, according to the first embodiment, it is possible to prevent the output terminal OUT from assuming the high impedance state when making the transition from the idle period to the output period, and when making the transition from the output period to the idle period. In other words, when switching the pull-up state of the output terminal OUT according to the output signal OUT output from the output terminal OUT, it is possible to prevent the output terminal OUT from assuming the high impedance state.

For example, by providing the transition period in which the high-level periods of the signal IN and the enable signal EN, and the low-level period of the enable signal POEN overlap, it is possible to prevent the output terminal OUT from assuming the high impedance state. Accordingly, it is possible to prevent the output signal line OUT from being affected by noise and making a transition to an erroneous level, thereby preventing an erroneous operation of the memory device 200.

The control signal generating circuit 60 can generate the enable signals EN and POEN having different timings, based on the single control signal CONT. In addition, the control signal generating circuit 60, having the simple configuration including the OR circuit 64 and the AND circuit 66, can generate the enable signals EN and POEN having the predetermined inclusion relationship. Further, by providing the transition period in which the high-level periods of the signal IN and the enable signal EN and the low-level period of the enable signal POEN overlap, it is possible to prevent the output terminal OUT from assuming the high impedance state.

During the idle period, because the pMOS 51 exclusively for the pull-up fixes the output signal OUT to the high level H, it is possible to prevent the BT degradation of the pMOS of the output buffer 20 which outputs the output signal OUT during the output period. In other words, the BT degradation is caused to occur in the pMOS 51 which does not affect the operation during the output period, in place of the pMOS of the output buffer 20, and thus, it is possible to prevent the output timing and the phase of the output signal OUT, output to memory device 200, from deviating from normal values for the output timing and the phase. Consequently, it is possible to prevent the operating margin of the memory device 200 from deteriorating.

The above described effects can be obtained, not only for the output signal OUT, but also for the output signal /OUT. Moreover, by using the latch circuit 62, it is possible to generate the delayed control signal CONTD which causes the delay of the clock cycle time, and the delay time can be set without being affected by the variations or the like of the manufacturing process.

Second Embodiment

Figure 9:
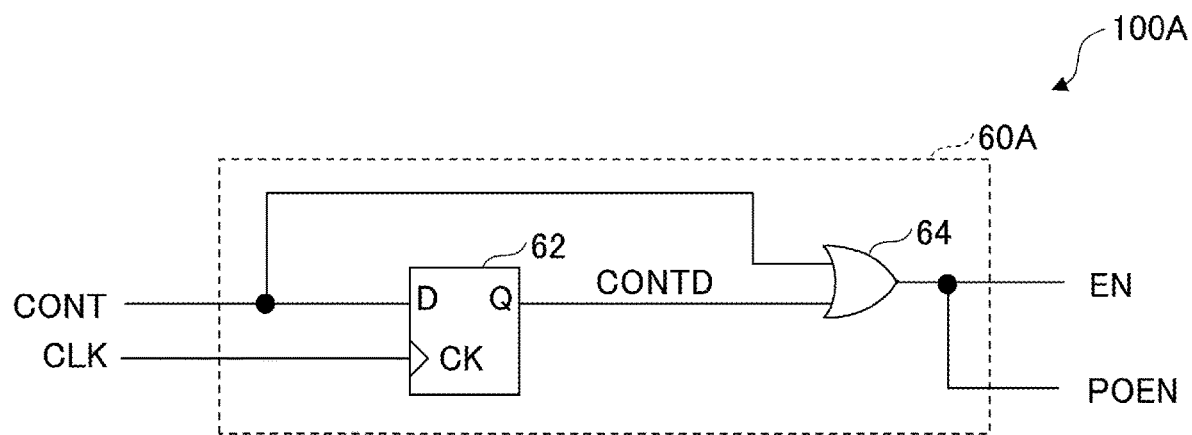
FIG. 9 is a diagram illustrating a control signal generating circuit which generates an enable signal in the semiconductor integrated circuit according to a second embodiment.

FIG. 9 illustrates a control signal generating circuit 60A which generates the enable signals EN and POEN in a semiconductor integrated circuit 100A according to a second embodiment. A configuration of the semiconductor integrated circuit 100A according to this embodiment is similar to that of the semiconductor integrated circuit 100 illustrated in FIG. 1 or FIG. 6, except that the control signal generating circuit 60A differs from the control signal generating circuit 60 illustrated in FIG. 2. The control signal generating circuit 60A does not include the AND circuit 66 of FIG. 2, and outputs the enable signals EN and POEN from the OR circuit 64. When this embodiment is applied to the semiconductor integrated circuit 100 illustrated in FIG. 6, the enable signal NOEN 2 may be generated by inverting the logic of the output of the OR circuit 64 illustrated in FIG. 9 by an inverter.

Figure 10:
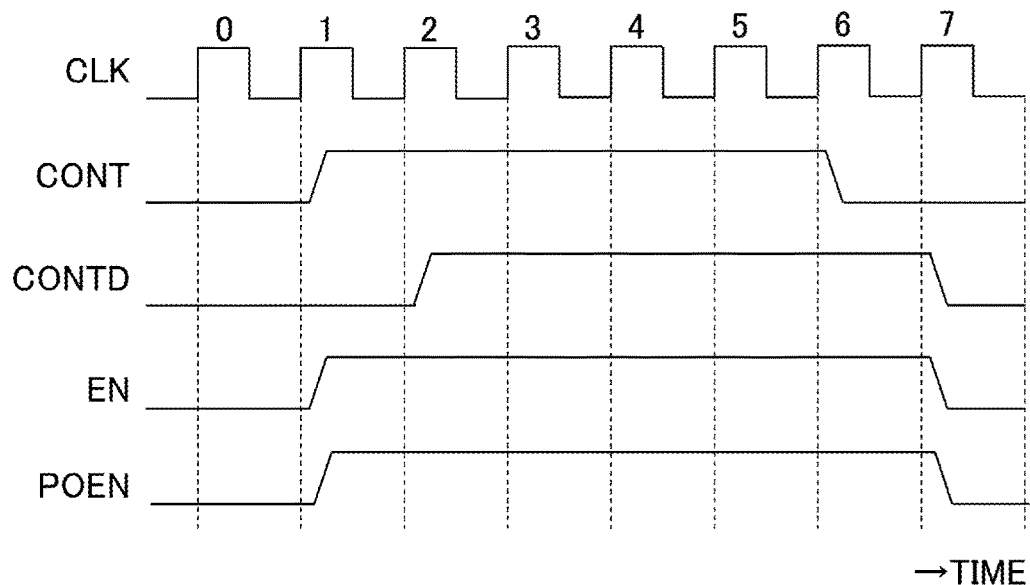
FIG. 10 is a diagram illustrating timings of signals which operates the control signal generating circuit illustrated in FIG. 9.

FIG. 10 illustrates the timings of the signals which operate the control signal generating circuit 60A illustrated in FIG. 9. A detailed description of FIG. 10 for the same waveforms as FIG. 3 will be omitted. In this embodiment, the enable signals EN and POEN have the same waveform, and have a rising edge corresponding to the rising edge of the control signal CONT, and a falling edge corresponding to the falling edge of the delayed control signal CONTD.

FIG. 11 illustrates the logic (truth table) of the signals which operate the output circuit 10 illustrated in FIG. 1 in the second embodiment. FIG. 11 is the same as the truth table illustrated in FIG. 4 without the transition period. In other words, the output circuit 10 of the semiconductor integrated circuit 100A generates an output signal OUT without the transition period.

Figure 12:
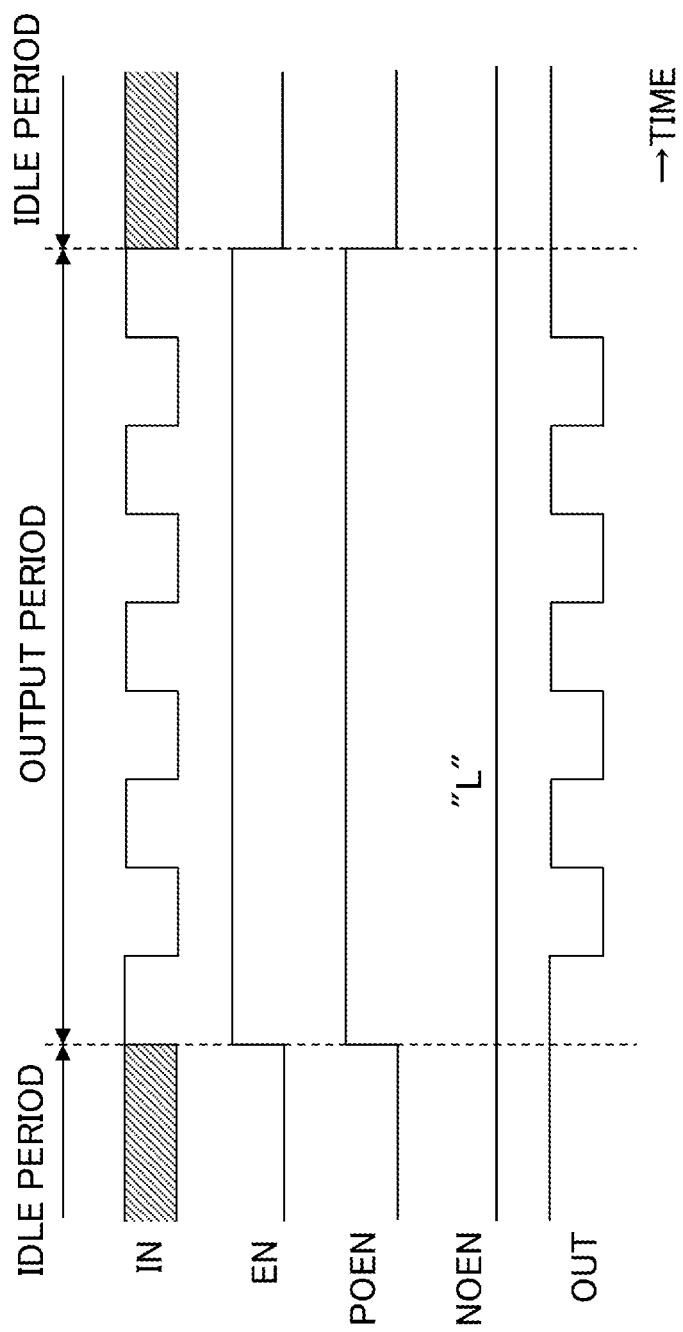
FIG. 12 is a diagram illustrating the timings of the signals which operate an output circuit according to the second embodiment.

FIG. 12 illustrates the timings of the signals which operate the output circuit 10 according to the second embodiment. A detailed description of FIG. 12 for the same waveforms as FIG. 5 will be omitted. In this embodiment, the high-level period of the enable signal EN becomes the output period, because there is no transition period. The high-level period of the enable signal EN may be set equal to the high-level period of the enable signal POEN illustrated in FIG. 5, in order not to decrease the access efficiency of the memory device 200. For this reason, the high-level period of the control signal CONT illustrated in FIG. 10, for example, becomes two clock cycles shorter than the high-level period of the control signal CONT illustrated in FIG. 2.

In the case where the transition period is omitted, if a rise timing of the enable signal EN is delayed with respect to a rise timing of the enable signal POEN at the start of the output period, the output terminal OUT assumes the high impedance state. In addition, if a fall timing of the enable signal POEN is delayed with respect to a fall timing of the enable signal EN at the end of the output period, the output terminal OUT assumes the high impedance state.

However, as illustrated in FIG. 10, the enable signals EN and POEN are the same signal output from the OR circuit 64. For this reason, the rising edge timings of the enable signals EN and POEN are the same, and the falling edge timings of the enable signals EN and POEN are the same. Accordingly, even in a case where the transition period is omitted, it is possible to prevent the output terminal OUT from assuming the high impedance state at the switching timing between the idle period and the output period, thereby preventing an erroneous operation of the memory device 200.

In addition, by omitting the transition period, it is possible to reduce the actual idle period. As a result, compared to FIG. 5, the access efficiency of the memory device 200 can be improved. Even in a case where the complementary output signals OUT and /OUT illustrated in FIG. 6 are supplied to the memory device 200, it is possible to omit the transition period. A timing error between the enable signals EN and NOEN 2 corresponds to one stage of the inverter connected to the output of the OR circuit 64 illustrated in FIG. 10. For this reason, it is possible to prevent the output terminals OUT and /OUT from assuming the high impedance state at the switching timing between the idle period and the output period.

As described above, according to the second embodiment, it is possible to obtain the same effects as the first embodiment. Further, in this embodiment, because the output signal of the OR circuit 64 is used as the enable signals EN and POEN, it is possible to prevent the output terminal OUT from assuming the high impedance state at the switching timing between the idle period and the output period, even in the case where the transition period is omitted. As a result, it is possible to prevent an erroneous operation of the memory device 200.

Third Embodiment

Figure 13:
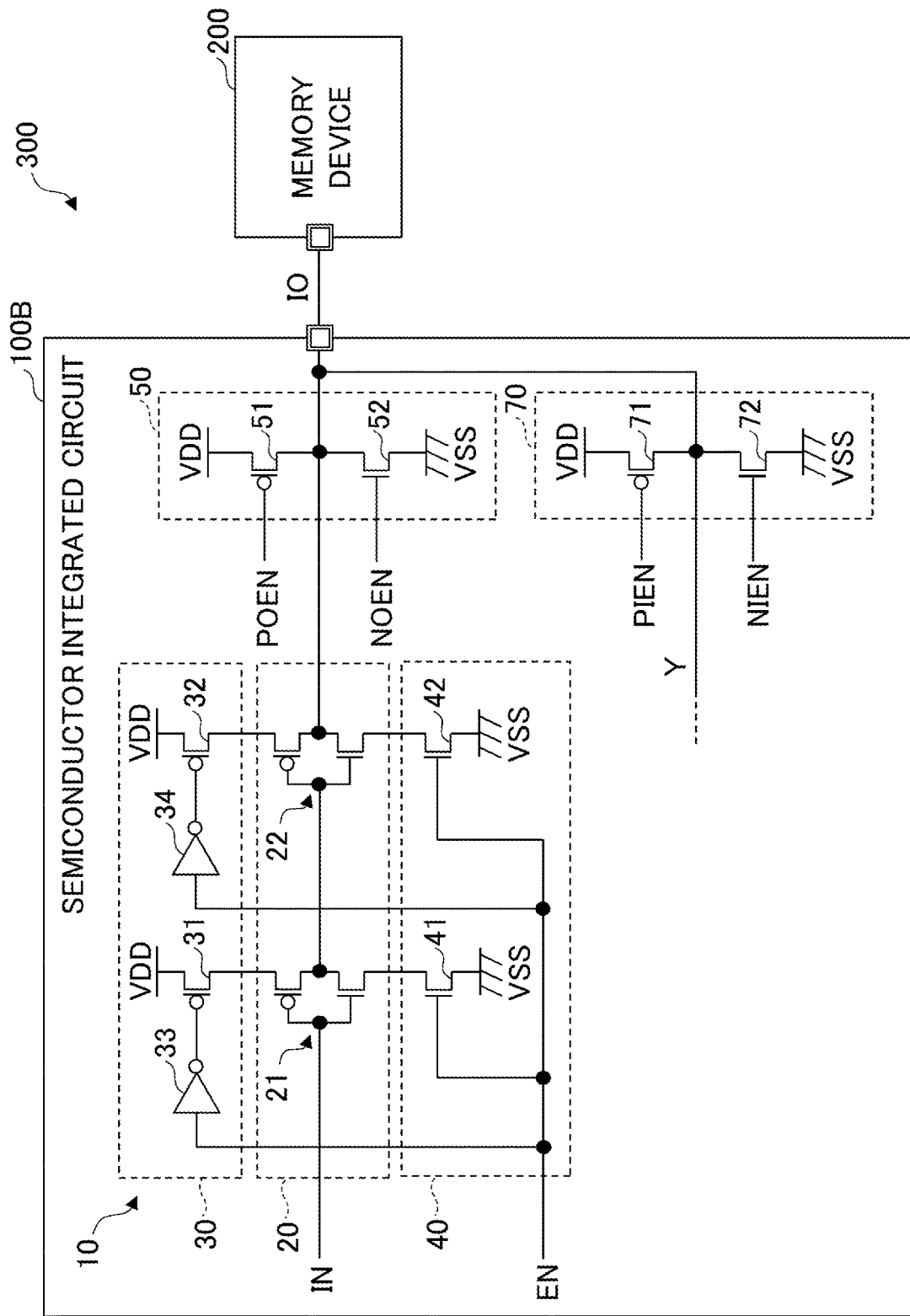
FIG. 13 is a diagram illustrating a configuration of the semiconductor integrated circuit according to a third embodiment.

FIG. 13 illustrates a configuration of a semiconductor integrated circuit 100B according to a third embodiment. In FIG. 13, those elements that are the same as those corresponding elements of the semiconductor integrated circuit 100 illustrated in FIG. 1 are designated by the same reference numerals, and a description thereof will be omitted.

The semiconductor integrated circuit 100B has the same configuration as the semiconductor integrated circuit 100 illustrated in FIG. 1, except that an input and output terminal (hereinafter also referred to as an "input/output terminal") IO is provided in place of the output terminal OUT illustrated in FIG. 1, and a pull-up/pull-down circuit 70 is connected to the input/output terminal IO. In other words, the system 300 is mounted with the semiconductor integrated circuit 100B, together with the memory device 200.

For example, a signal IO, which may be input to and output from the input/output terminal IO, may be a data strobe signal DQS. The semiconductor integrated circuit 100B outputs the data strobe signal DQS to the memory device 200, together with write data DQ (not illustrated), during a write cycle in which data are written to the memory device 200. In other words, the output circuit 10 operates during the write cycle, and outputs the signal IN, as the data strobe signal DQS, to the memory device 200 via the input/output terminal IO.

For example, the semiconductor integrated circuit 100B generates the data strobe signal DQS during the write cycle, so that the rising edge or the falling edge of the data strobe signal DQS appears at a center of the write data. For example, a circuit, which adjusts the phase of the data strobe signal DQS with respect to the phase of the write data, adjusts the phase of the signal IN. In a case where the memory device 200 operates with the DDR, the semiconductor integrated circuit 100B during the write cycle outputs the write data to the memory device 200 in correspondence with each of the rising edge and the falling edge of the data strobe signal DQS, respectively.

Moreover, during the read cycle in which the data are read from the memory device 200, the memory device 200 outputs the data strobe signal DQS together with the read data DQ. During the read cycle, the memory device 200 outputs the read data DQ to the semiconductor integrated circuit 100B via a data input/output terminal (not illustrated). For example, a timing of a transition edge of the data strobe signal DQS during the read cycle is the same as a timing of a transition edge of the read data DQ. In FIG. 13, a signal line, which transmits the data strobe signal DQS received via the input/output terminal IO during the read cycle to a reception circuit for the read data DQ, is designated by a symbol "Y", and the signal transmitted on the signal line Y may also be referred to as the signal Y. Because the signal line Y is directly connected to the input/output terminal IO, the logic of the signal Y is the same as that of the signal IO.

In FIG. 13, only the output circuit 10 (20, 30, 40, and 50) which outputs the signal IO (output signal) to the memory device 200 via the input/output terminal IO, and the pull-up/pull-down circuit 70 of the semiconductor integrated circuit 100B are illustrated. For this reason, a description of the circuit which outputs the write data DQ to the memory device 200, the circuit which receives the read data DQ output from the memory device 200, the data terminal DQ, or the like will be omitted.

The pull-up/pull-down circuit 70 includes a pMOS 71 connected between the power supply line VDD and the input/output terminal IO, and an nMOS 72 connected between the input/output terminal IO and the ground line VSS. The pMOS 71 assumes the conductive state (turns on) during a low-level period of an enable signal PIEN, and connects the input/output terminal IO to the power supply line VDD. The nMOS 52 assumes the conductive state (turns on) during a high-level period of an enable signal NIEN, and connects the output terminal OUT to the ground line VSS.

The pMOS 71 is an example of an input pull-up switch which functions as a resistive element in an on state thereof, and the nMOS 72 is an example of an input pull-down switch which functions as a resistive element in an on state thereof. For example, resistance values of the pMOS 71 and the nMOS 72 in the conductive states thereof may be on the order of approximately 1 kilo-ohms (kΩ, and may be in a range of several hundred Ω to several kΩ, for example. Resistances of the pMOS 51 and the nMOS 52 in the conductive states thereof may be on the order of approximately 100 kΩ, and may be in a range of 50 kΩ to 200 kΩ, for example.

FIG. 14 illustrates the logic (truth table) of the signals which operate the output circuit 10 and the pull-up/pull-down circuit 70 illustrated in FIG. 13. In FIG. 14, an output idle period indicates the idle period illustrated in FIG. 4. The logic of the enable signals EN, POEN, and NOEN, and the signal IN during the output idle period, the transition period, and the output period is the same as in FIG. 4. The logic of the signal IO (output signal) during the output idle period, the transition period, and the output period is the same as the logic of the output signal OUT in FIG. 4. The output idle period, the transition period, and the output period are provided to output the data strobe signal DQS to the memory device 200 during the write cycle.

An input period is a period in which the read data DQ and the data strobe signal DQS from the memory device 200 are input during the read cycle. An input idle period is a period which precedes the input period during the read cycle. The input idle period may be provided before and after the input period. During the input period and the input idle period, the enable signals EN and NOEN are set to the low level L, the enable signal POEN is set to the high level H, and the signal IN is set to the high level H or the low level L. Because the input/output terminal IO and the signal line Y are physically connected, the logic of the input/output terminal IO and the logic of the signal line Y are the same.

The enable signal PIEN is set to the high level H during the output idle period, the transition period, the output period, and the input idle period, and is set to the low level L during the input period. For this reason, the pMOS 71 of the pull-up/pull-down circuit 70 assumes the conductive state during the input period, and assumes the non-conductive state during periods other than the input period.

The enable signal NIEN is set to the low level during the output idle period, the transition period, and the output period, and is set to the high level H during the input idle period and the input period. For this reason, the nMOS 72 of the pull-up/pull-down circuit 70 assumes the conductive state during the input idle period and the input period, and assumes the non-conductive state during periods other than the input idle period and the input period.

During the input idle period, only the nMOS 72 assumes the conductive state, and thus, the input/output terminal IO and the signal line Y assume the low level L. During the input period, both the pMOS 71 and the nMOS 72 assume the conductive state, and thus, the high level H of the input/output terminal IO and the signal line Y assumes a value lower than the power supply voltage VDD, while the low level L of the input/output terminal IO and the signal line Y assumes a value higher than the ground voltage VSS. Hence, an amplitude of the signal transmitted to the input/output terminal IO and the signal line Y can be made small, thereby enabling a high-speed transmission of the signal.

Figure 15:
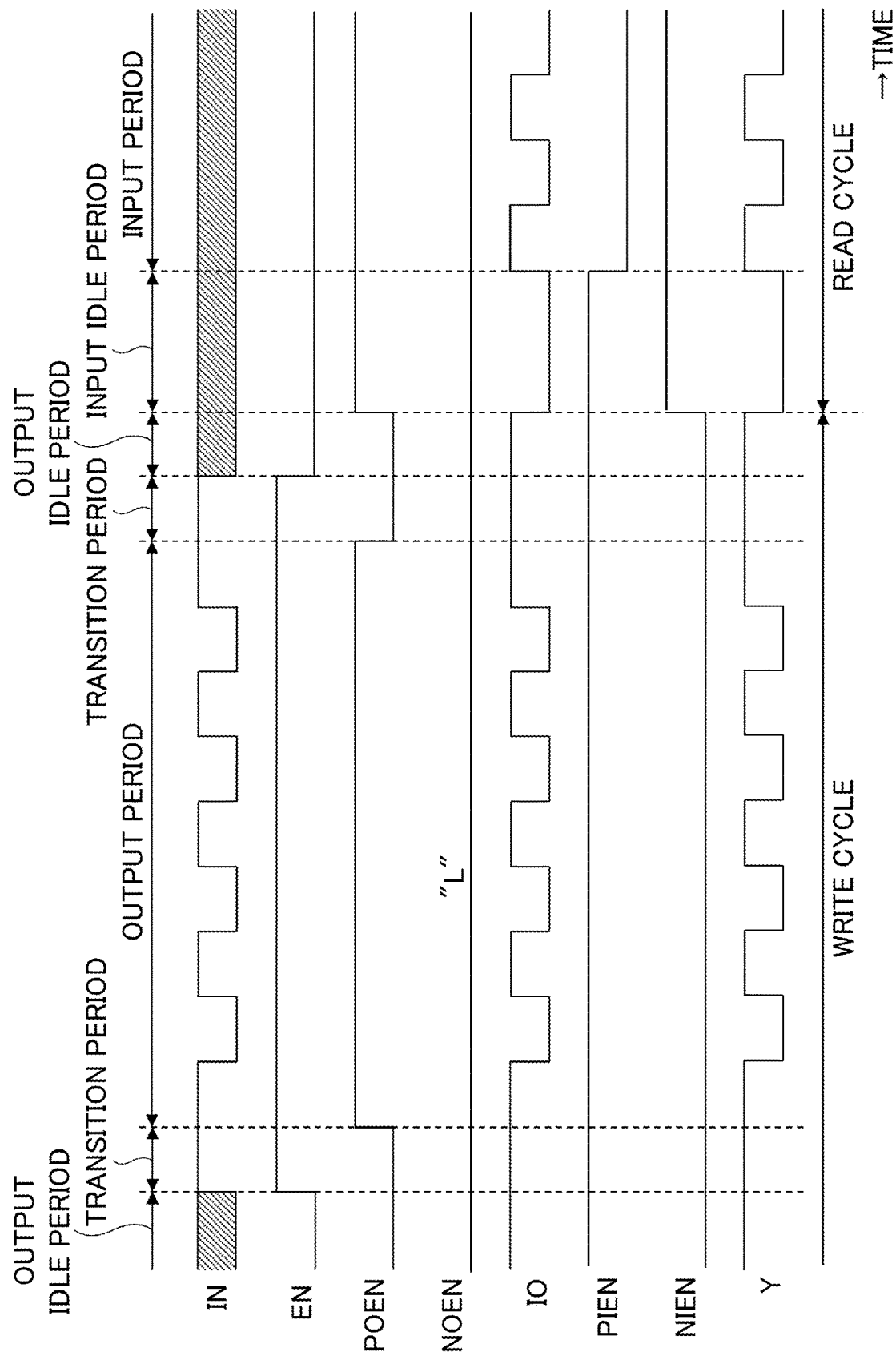
FIG. 15 is a diagram illustrating the timings of the signals which operate the output circuit and the pull-up and pull-down circuits illustrated in FIG. 13.

FIG. 15 illustrates the timings of the signals which operate the output circuit 10 and the pull-up/pull-down circuit 70 illustrated in FIG. 13. The output idle period corresponds to the idle period of FIG. 5. The output idle period, the transition period, the output period, and the transition period indicate a portion of the write cycle in which the data are written to the memory device 200. The input idle period and the input period indicate a portion of the read cycle in which the data are read from the memory device 200. In other words, FIG. 15 illustrates an example in which a write cycle is followed by a read cycle.

The waveforms of the signal IN and the enable signals EN, POEN, and NOEN during the output idle period, the transition period, and the output period are the same as in FIG. 5. In addition, the waveforms of the signal IO and the signal Y during the output idle period, the transition period, and the output period are the same as the waveform of the output signal OUT in FIG. 5. During the output idle period, the transition period, and the output period, the pull-up operation and the pull-down operation of the pull-up/pull-down circuit 70 are stopped, because the enable signal PIEN is set to the high level H, and the enable signal NIEN is set to the low level L. Further, the semiconductor integrated circuit 100B outputs the signal IN, as the output signal, to the memory device 200 via the input/output terminal IO.

In order to set the enable signal EN to the low level L during the input idle period and the input period, the output circuit 10 stops the output operation to output the signal IN. In addition, during the input idle period and the input period, the pull-up operation and the pull-down operation of the pull-up/pull-down circuit 50 are stopped, because the enable signal POEN is set to the high level H, and the enable signal NOEN is set to the low level L.

During the input idle period, the nMOS 72 assumes the conductive state, and the input/output terminal IO and the signal line Y are set to the low level L, because the enable signal NIEN is to the high level H. In addition, during the input period, the logic of the input/output terminal IO and the signal line Y varies according to the logic of the signal (for example, the data strobe signal DQS) output from the memory device 200 to the input/output terminal IO. In this state, because the pMOS 71 and the nMOS 72 assume the conductive state due to the enable signal PIEN having the low level L and the enable signal NIEN having the high level H, it is possible to make the signal amplitude small. The pull-up operation and the pull-down operation of the pull-up/pull-down circuit 70 may be stopped by setting the enable signal PIEN to the high level H and setting the enable signal NIEN to the low level L during the input period. In this case, the signal amplitude becomes a difference between the power supply voltage VDD and the ground voltage VSS.

The semiconductor integrated circuit 100B may include the control signal generating circuit 60A in place of the control signal generating circuit 60 illustrated in FIG. 2. In this case, the transition period in FIG. 14 and FIG. 15 may be omitted.

Figure 16:
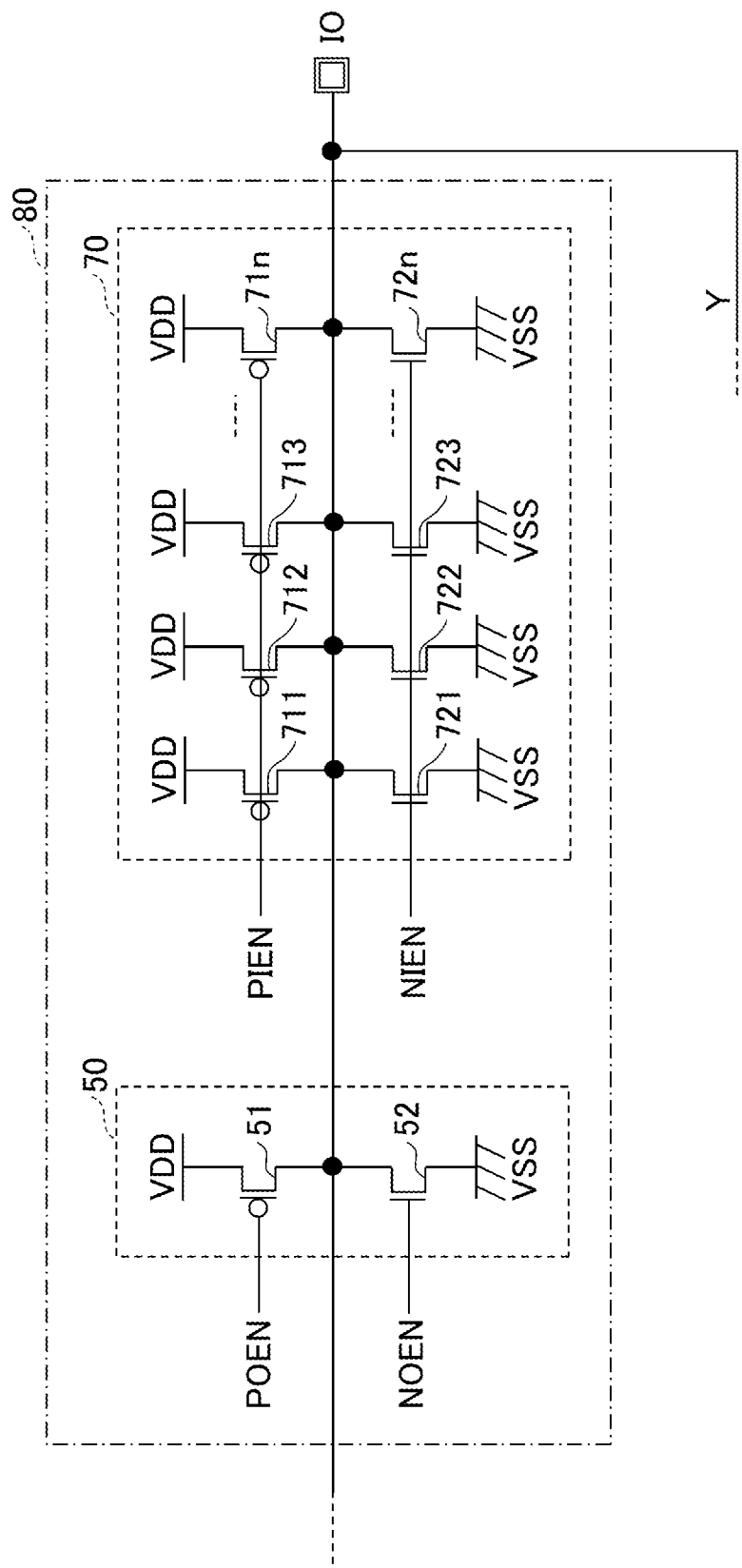
FIG. 16 is a diagram illustrating an example of a configuration of the pull-up and pull-down circuit illustrated in FIG. 13.

FIG. 16 illustrates an example of the configuration of pull-up/pull-down circuits 50 and 70 illustrated in FIG. 13. For example, n+1 or more pMOSs 71 exclusively for the pull-up and having the same configuration, connected in parallel between the power supply line VDD and the input/output terminal IO, may be arranged in a region 80 where the pull-up/pull-down circuits 50 and 70 are formed, where n is a natural number greater than or equal to 1 and is 3 in the example illustrated in FIG. 16. Further, n+1 or more nMOSs 72 exclusively for the pull-down and having the same configuration, connected in parallel between the input/output terminal IO and the ground line VSS, may be arranged in the region 80.

In addition, the n pMOSs 71 (711, 712, . . . , and 71n) to be used as the pull-up resistor is selected according to the resistance value at the time of the pull-up (on state of the pMOSs 71) of the pull-up/pull-down circuit 70. The n nMOSs 72 (721, 722, . . . , and 72n) to be used as the pull-down resistor is selected according to the resistance value at the time of pull-down (on state of the nMOSs 72) of the pull-up/pull-down circuit 70. The number of pMOSs 71 to be used as the pull-up resistor may be different from the number of nMOSs 72 to be used as the pull-down resistor.

Further, the pMOS 51 of the pull-up/pull-down circuit 50 may be provided by utilizing the pMOS 71 which is not used for the pull-up/pull-down circuit 70. Similarly, the nMOS 52 of the pull-up/pull-down circuit 50 may be provided by utilizing the nMOS 72 which is not used for the pull-up/pull-down circuit 70. In this example, the number of pMOSs 51 of the pull-up/pull-down circuit 50 is smaller than the number of pMOSs 71 of the pull-up/pull-down circuit 70. In addition, the number of nMOSs 52 of the pull-up/pull-down circuit 50 is smaller than the number of nMOSs 72 of the pull-up/pull-down circuit 70.

Accordingly, the pull-up/pull-down circuits 50 and 70 can be provided utilizing transistors having a common layout and the same structure. For example, because the resistance value of the pull-up/pull-down circuit 70 is lower than the resistance value of the pull-up/pull-down circuit 50, a plurality of transistors having the same size as the transistors of the pull-up/pull-down circuit 50 may be connected in parallel and used for the pull-up/pull-down circuit 70. In addition, the pull-up/pull-down circuit 70 may include a number of surplus transistors for adjusting the resistance value. In this case, the surplus transistors of the pull-up/pull-down circuit 70 may be utilized for the pull-up/pull-down circuit 50.

Figure 17:
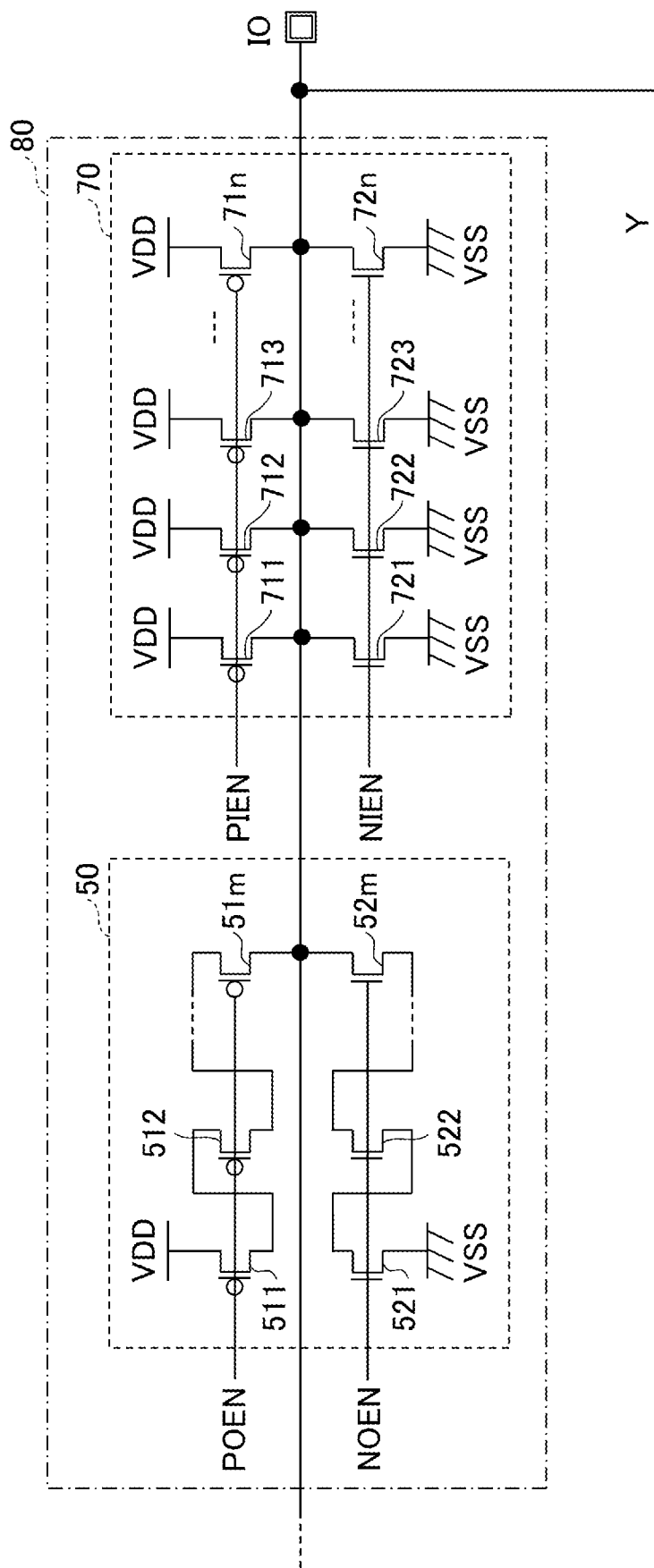
FIG. 17 is a diagram illustrating another example of the configuration of the pull-up and pull-down circuit illustrated in FIG. 13.

FIG. 17 illustrates another example of the configuration of pull-up/pull-down circuits 50 and 70 illustrated in FIG. 13. In FIG. 17, the pMOSs 51 of the pull-up/pull-down circuit 50 may be provided by connecting m pMOSs 51 (511, 512, . . . , and 51m) in series between the power supply line VDD and the input/output terminal IO, where m is a natural number greater than or equal to 1, and is 3 in the example illustrated in FIG. 17. The nMOSs 52 of the pull-up/pull-down circuit 50 may be provided by connecting m nMOSs 52 (521, 522, . . . , and 52m) in series between the input/output terminal IO and the ground line VSS.

In FIG. 17, the pMOS 51 and the nMOS 52 of the pull-up/pull-down circuit 50 may also be provided by utilizing the unused pMOS 71 and nMOS 72 of the pull-up/pull-down circuit 70. Hence, even when the difference between the resistance values of the pull-up/pull-down circuits 50 and 70 is large, the pull-up/pull-down circuits 50 and 70 can be provided utilizing the transistors having the common layout and the same structure. The pull-up resistance and the pull-down resistance of the pull-up/pull-down circuit 50 may be provided by connecting the transistor and a diffused resistor in series, for example.

As described above, according to the third embodiment, it is possible to obtain the same effects as the first and second embodiments. Further, in this embodiment, it is possible to prevent the input/output terminal IO from assuming the high impedance state when making the transition from the idle period to the output period, and when making the transition from the output period to the idle period. It is also possible to prevent the input/output terminal IO from assuming the high impedance state when switching from the signal output period (output idle period) to the signal input period (input idle period). Moreover, the pull-up/pull-down circuits 50 and 70 may be provided utilizing the transistors having the common layout and the same structure.

Fourth Embodiment

Figure 18:
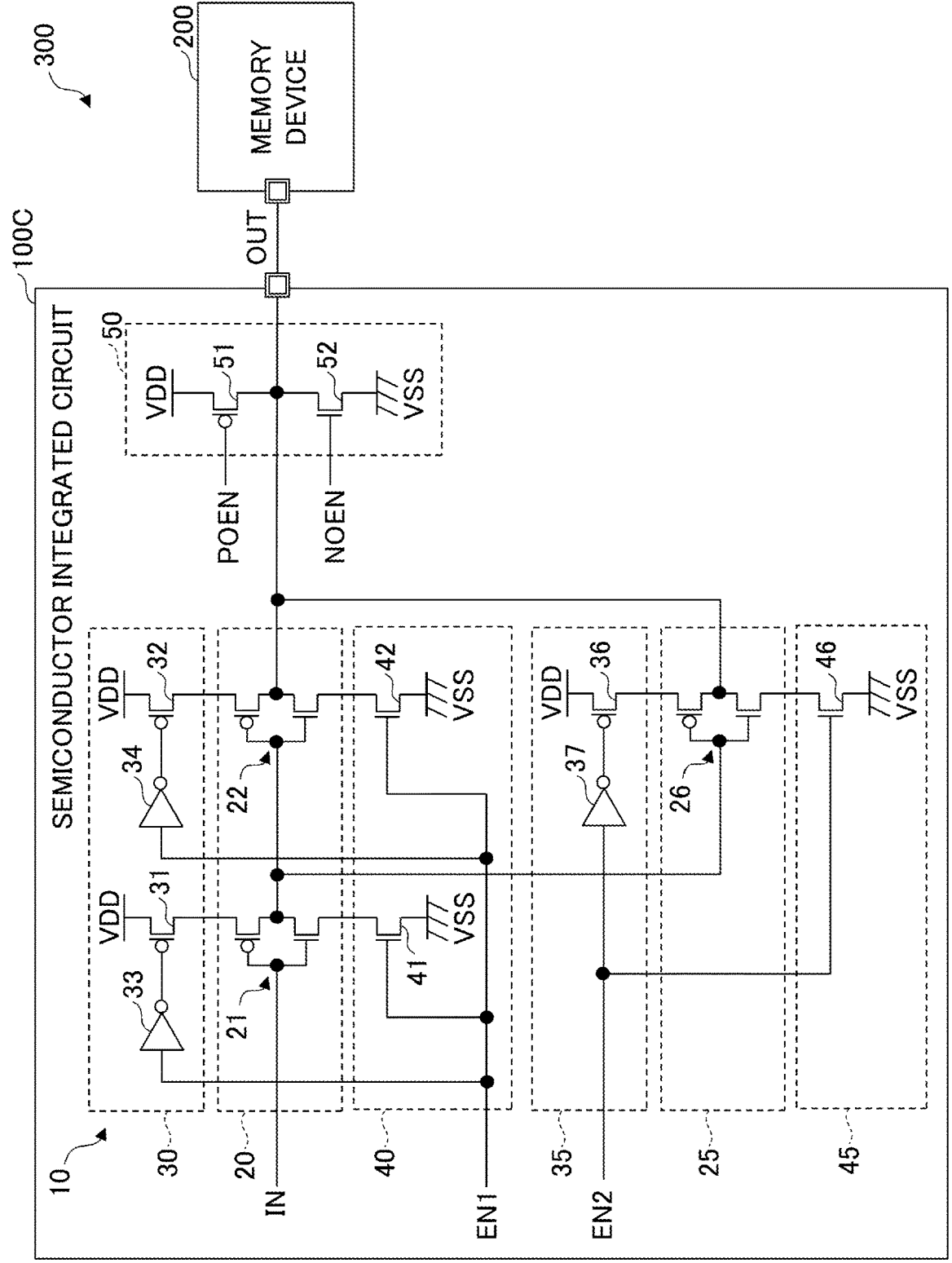
FIG. 18 is a diagram illustrating a configuration of the semiconductor integrated circuit according to a fourth embodiment.

FIG. 18 illustrates a configuration of a semiconductor integrated circuit 100C according to a fourth embodiment.

In FIG. 18, those elements that are the same as those corresponding elements of the semiconductor integrated circuit 100 illustrated in FIG. 1 are designated by the same reference numerals, and a description thereof will be omitted.

The configuration of the output circuit 10 of the semiconductor integrated circuit 100C differs from the output circuit 10 illustrated in FIG. 1. The output circuit 10 illustrated in FIG. 18 includes an output buffer 25, and high impedance control circuits 35 and 45, in addition to the elements forming the output circuit 10 illustrated in FIG. 1.

The output buffer 25 includes a CMOS inverter 26. The CMOS inverter 26 receives the signal output from the CMOS inverter 21 of the output buffer 20, and outputs a signal to the output terminal OUT. In other words, the output buffer 25 has a function to output the signal IN to the output terminal OUT, similar to the output buffer 20.

The high impedance control circuit 35 includes a pMOS 36 connected between the power supply line VDD and a source of a pMOS of the CMOS inverter 26, and an inverter 37. A gate of the pMOS 36 receives an inverted logic of an enable signal EN2 via the inverter 37. The enable signal EN2 is an example of the power control signal.

The high impedance control circuit 45 includes an nMOS 46 connected between a source of an nMOS of the CMOS inverter 26 and the ground line VSS. A gate of the nMOS 46 receives the enable signal EN2. As described above, the output circuit 10 includes a plurality of output buffers 20 and 25 for outputting the signal IN as the output signal OUT to the output terminal OUT, and the plurality of high impedance control circuits 30, 40, 35, and 45 corresponding to the output buffers 20 and 25, respectively.

In this embodiment, the number of output buffers 20 and 25 used to output the output signal OUT is varied according to a load connected to the output terminal OUT. In other words, the number of output buffers 20 and 25 used to output the output signal OUT is varied according to the specification of a driving capability of the output signal OUT output from the semiconductor integrated circuit 100C. The pull-up/pull-down circuit 50 is provided in common with respect to the plurality of output buffers 20 and 25.

For example, in a case of a first specification of the driving capability, only the output buffer 20 is used during the output period (FIG. 5). On the other hand, in a case of a second specification of the driving capability, with a higher driving capability than the first specification, both the output buffers 20 and 25 are used during the output period. The semiconductor integrated circuit 100C may include a plurality of output buffers 25, a plurality of high impedance control circuits 35, and a plurality of high impedance control circuits 45.

Figure 19:
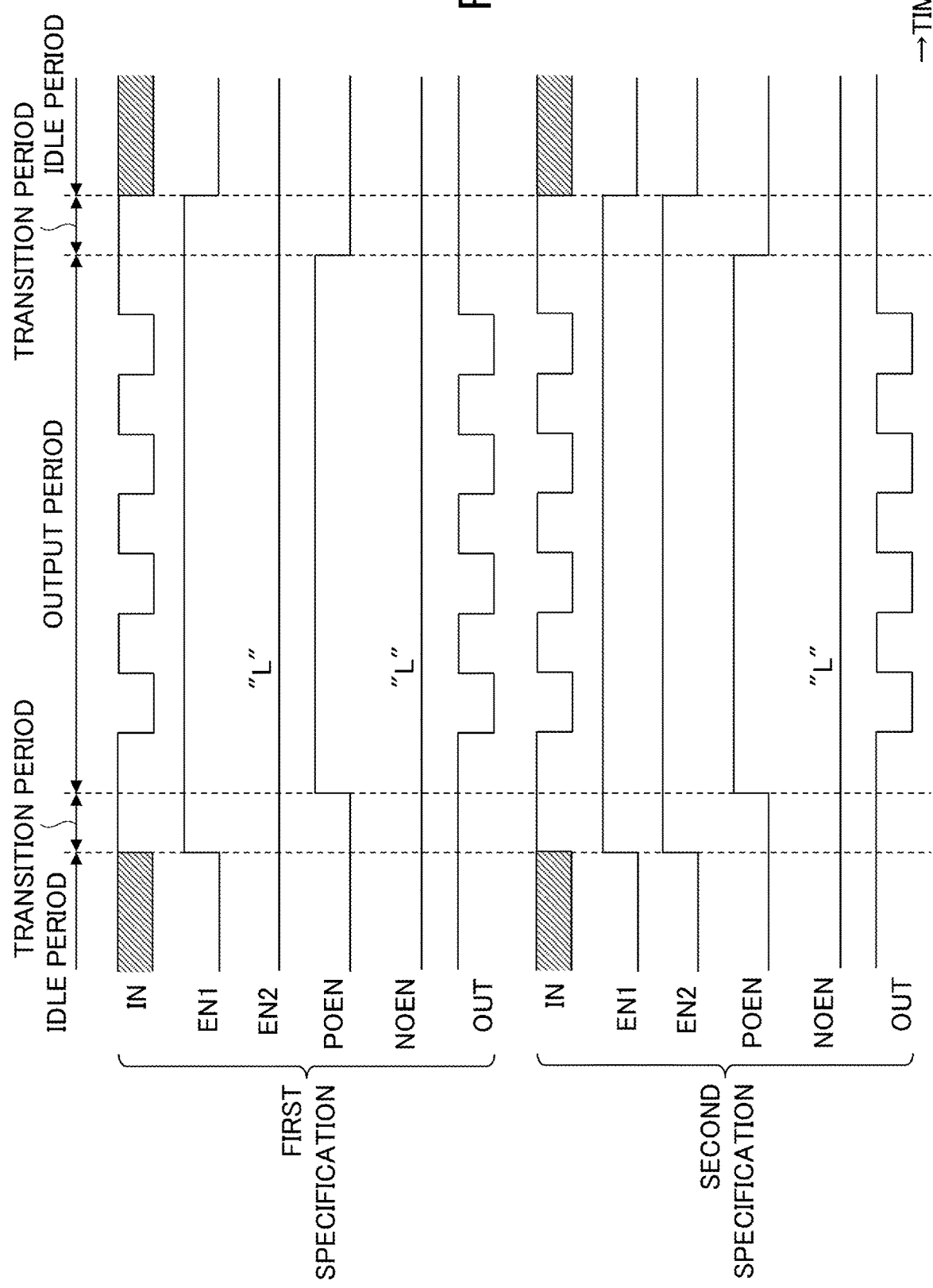
FIG. 19 is a diagram illustrating the timings of signals which operate output circuits according to a first specification and a second specification.

FIG. 19 illustrates the timings of the signals which operate the output circuits 10 according to the first specification and the second specification. A detailed description of FIG. 19 for the same operations as FIG. 5 will be omitted. For example, according to the first specification with the relatively low driving capability, only the enable signal EN1 is set to the high level H during the transition period and the output period. According to the second specification with the relatively high driving capability, both the enable signals EN1 and EN2 are set to the high level H during the transition period and the output period. The timings of the signals other than the enable signals EN1 and EN2 are the same for the first specification and the second specification.

Similar to FIG. 12, the transition period may be omitted. In addition, as illustrated in FIG. 6, each of the complementary signals may be output from a plurality of output buffers.

Further, as illustrated in FIG. 13, the signal to be output to the input/output terminal IO may be output from a plurality of output buffers.

As described above, according to the fourth embodiment, it is possible to obtain the same effects as the first through third embodiments. Moreover, in this embodiment, even when providing the plurality of output buffers 20 and 25, the pull-up control of the output terminal during the idle period can be performed by the pull-up/pull-down circuit 50 which is provided in common with respect to the plurality of output buffers 20 and 25.

In the first and second embodiments, an example of controlling the output terminal OUT for the output signal, such as the read enable signal or the like, is illustrated. In the third embodiment, an example of controlling the input/output terminal IO for the input/output signal, such as the data strobe signal or the like, is illustrated. However, the circuit illustrated in FIG. 1 which outputs the read enable signal, and the circuit illustrated in FIG. 13 which inputs and outputs the data strobe signal, for example, may be provided in a semiconductor integrated circuit which controls the access to the memory device 200, such as a NAND flash memory or the like. In this case, the circuit illustrated in FIG. 13 may be configured as a circuit for inputting and outputting the complementary input/output signal (for example, the data strobe signal), similar to FIG. 6. In this case, the output terminals OUT and /OUT in FIG. 6 are changed to input/output terminals IO and /IO, and the pull-up/pull-down circuit 70 illustrated in FIG. 13 is connected to each of the input/output terminals IO and /IO.

According to the disclosed technique, when the output terminal is set to a predetermined voltage in response to an output signal output from the output terminal, it is possible to prevent the output terminal from becoming in a high impedance state.

Although the embodiments are numbered with, for example, "first," "second," "third," or "fourth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor integrated circuit, comprising:
an output buffer configured to output a memory control signal, which is to be supplied to a memory device, to an external terminal coupled to the memory device;
a power supply control circuit configured to control a supply of a power supply voltage from a power supply line to the output buffer, based on a power control signal;
a pull-up control circuit configured to control a pull-up of the external terminal, based on a pull-up control signal; and
a control signal generating circuit configured to
generate, during an output period in which the memory control signal is output to the external terminal, the power control signal which controls the power supply control circuit to supply the power supply voltage to the output buffer, and the pull-up control signal which controls the pull-up control circuit to stop the pull-up of the external terminal, and generate, during an idle period in which the memory control signal is not output to the external terminal, the power control signal which controls the power supply control circuit to stop the supply of the power supply voltage to the output buffer, and the pull-up control signal which controls the pull-up control circuit to perform the pull-up of the external terminal.

2. The semiconductor integrated circuit as claimed in claim 1, further comprising:
a delay circuit configured to delay a timing signal generated in correspondence with the output period, and generate a delayed timing signal,
wherein the control signal generating circuit generates, during the output period and the idle period, the power control signal which is output to the power supply control circuit, and the pull-up control signal which is output to the pull-up control circuit, based on the timing signal and the delayed timing signal.

3. The semiconductor integrated circuit as claimed in claim 2, wherein the control signal generating circuit includes
an OR circuit configured to output, during the output period, a logical sum of the timing signal and the delayed timing signal, as the power control signal, and
an AND circuit configured to output, during the output period, a logical product of the timing signal and the delayed timing signal, as the pull-up control signal.

4. A semiconductor integrated circuit comprising:
an output buffer configured to output a memory control signal, which is to be supplied to a memory device, to an external terminal coupled to the memory device, the output buffer including a p-channel MOS transistor;
a power supply control circuit including a power switch, coupled between a power supply line which supplies a power supply voltage, and a source of the p-channel MOS transistor of the output buffer, and configured to turn on or off based on a power control signal;
a pull-up control circuit including a pull-up switch, coupled between the power supply line and the external terminal, and configured to turn on or off based on a pull-up control signal, the pull-up switch functioning as a resistive element in an on state thereof; and
a control signal generating circuit configured to generate the power control signal and the pull-up control signal during an output period in which the memory control signal is output to the external terminal, and an idle period in which the memory control signal is not output to the external terminal, based on a timing signal generated in correspondence with the output period.

5. The semiconductor integrated circuit as claimed in claim 4, further comprising:
a delay circuit configured to delay a timing signal generated in correspondence with the output period, and generate a delayed timing signal,
wherein the control signal generating circuit generates, during the output period and the idle period, the power control signal which is output to the power supply control circuit, and the pull-up control signal which is output to the pull-up control circuit, based on the timing signal and the delayed timing signal.

6. The semiconductor integrated circuit as claimed in claim 5, wherein the control signal generating circuit includes
an OR circuit configured to output, during the output period, a logical sum of the timing signal and the delayed timing signal, as the power control signal, and
an AND circuit configured to output, during the output period, a logical product of the timing signal and the delayed timing signal, as the pull-up control signal.

7. The semiconductor integrated circuit as claimed in claim 5, wherein the delay circuit includes a latch circuit configured to latch the timing signal in synchronism with a clock signal, and output the latched timing signal as the delayed timing signal.

8. The semiconductor integrated circuit as claimed in claim 4, wherein
the external terminal is an input and output terminal configured to output the memory control signal to the memory device during the output period, and input the memory control signal during the input period,
the semiconductor integrated circuit further comprising:
an input pull-up switch, coupled between the power supply line and the external terminal, and configured to pull-up the external terminal, the input pull-up switch functioning as a resistive element in an on state thereof, and
an input pull-down switch, coupled between the ground line and the external terminal, and configured to pull-down the external terminal, the input pull-down switch functioning as a resistive element in on state thereof.

9. The semiconductor integrated circuit as claimed in claim 8, wherein the input pull-up switch and the input pull-down switch turn off during the output period, and turn on during the input period.

10. The semiconductor integrated circuit as claimed in claim 8, wherein a resistance value during the pull-up by the pull-up control circuit is higher than a resistance value during the pull-up by the input pull-up switch.

11. The semiconductor integrated circuit as claimed in claim 10, further comprising:
a plurality of p-channel MOS transistors for pull-up, having the same configuration and coupled in parallel between the power supply line and the external terminal,
wherein the input pull-up switch includes a predetermined number of the p-channel MOS transistors among the plurality of p-channel MOS transistors for the pull-up, selected according to the resistance value during the on state thereof, and
wherein the pull-up control circuit includes a number of p-channel MOS transistors among the plurality of p-channel MOS transistors for the pull-up, less than the predetermined number of p-channel MOS transistors, and unused in the input pull-up switch.

12. The semiconductor integrated circuit as claimed in claim 4, further comprising:
a plurality of output buffers configured to output the memory control signal to the external terminal; and
a plurality of the power control circuits corresponding to the plurality of the output buffers, respectively,
wherein the control signal generating circuit outputs the power control signal to the power supply control circuit corresponding to the output buffer used to output the memory control signal among the plurality of the output buffers, and wherein the pull-up control circuit is provided in common with respect to the plurality of output buffers.

13. The semiconductor integrated circuit as claimed in claim 4, further comprising:
a complementary output buffer configured to output a complementary memory control signal having a logical value opposite to that of the memory control signal to a complementary external terminal;
a complementary power supply control circuit configured to control a supply of a complementary power supply voltage from a complementary power supply line to the complementary output buffer, based on the power control signal; and
a pull-down control circuit configured to control a pull-down of the complementary external terminal based on a pull-down control signal,
wherein the control signal generating circuit is configured to
generate, during the output period in which the memory control signal is output to the external terminal and the complementary memory control signal is output to the complementary external terminal, the power control signal which controls the power supply control circuit to supply the power supply voltage to the output buffer, and controls the complementary power supply control circuit to supply the complementary power supply voltage to the complementary output buffer, the pull-up control signal which controls the pull-up control circuit to stop the pull-up of the external terminal, and the pull-down control signal which controls the pull-down control circuit to stop the pull-down of the complementary external terminal, and
generate, during the idle period in which the memory control signal is not output to the external terminal and the complementary memory control signal is not output to the complementary external terminal, the power control signal which controls the power supply control circuit to stop the supply of the power supply voltage to the output buffer, and controls the complementary power supply control circuit to stop the supply of the complementary power supply voltage to the complementary output buffer, the pull-up control signal which controls the pull-up control circuit to pull-up the external terminal, and the pull-down control signal which controls the pull-down control circuit to pull-down the complementary external terminal.

14. The semiconductor integrated circuit as claimed in claim 13, wherein
the power supply control circuit and the complementary power supply control circuit have the same circuit configuration,
the output buffer and the complementary output buffer have the same circuit configuration, and
the pull-up control circuit and the pull-down control circuit have the same circuit configuration.

15. The semiconductor integrated circuit as claimed in claim 4, wherein
the memory device is a NAND type flash memory, and the memory control signal is a read enable signal.

16. The semiconductor integrated circuit as claimed in claim 8, wherein
the memory device is a NAND type flash memory, and the memory control signal is a data strobe signal.

* * * * *